United States Patent
Wagner et al.

(10) Patent No.: US 11,672,127 B2
(45) Date of Patent: Jun. 6, 2023

(54) FERROELECTRIC SEMICONDUCTOR DEVICE AND METHOD FOR PRODUCING A MEMORY CELL

(71) Applicants: Fraunhofer-Gesellschaft zur Foerderung der angewandten Forschung e.V., Munich (DE); Christian-Albrechts-Universitaet zu Kiel, Kiel (DE)

(72) Inventors: Bernhard Wagner, Itzehoe (DE); Simon Fichtner, Itzehoe (DE); Fabian Lofink, Itzehoe (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 17/161,384

(22) Filed: Jan. 28, 2021

(65) Prior Publication Data
US 2021/0151445 A1    May 20, 2021

Related U.S. Application Data

(63) Continuation of application No. PCT/EP2019/069963, filed on Jul. 24, 2019.

(30) Foreign Application Priority Data

Jul. 31, 2018 (DE) ............... 10 2018 212 736.0

(51) Int. Cl.
*H01L 29/78* (2006.01)
*H01L 29/66* (2006.01)
(Continued)

(52) U.S. Cl.
CPC .... *H01L 27/1159* (2013.01); *H01L 29/40111* (2019.08); *H01L 29/516* (2013.01); *H01L 29/6684* (2013.01); *H01L 29/78391* (2014.09)

(58) Field of Classification Search
CPC ........... H01L 27/1159; H01L 29/40111; H01L 29/516; H01L 29/6684; H01L 29/78391; H01L 29/2003; G11C 11/223
(Continued)

(56) References Cited

U.S. PATENT DOCUMENTS

| 6,091,621 A | 7/2000 | Wang et al. |
| 6,441,417 B1 | 8/2002 | Zhang et al. |

(Continued)

FOREIGN PATENT DOCUMENTS

| CN | 105483629 A | 4/2016 |
| DE | 102015015854 A1 | 6/2017 |

OTHER PUBLICATIONS

Scott, J. F, "Ferroelectric Memories, Chapter 12.1 Ferroelectric Field-Effect Transistors (FETs)", Springer Heidelberg, 2000, 2000, 7 pp.
(Continued)

*Primary Examiner* — Sheikh Maruf
(74) *Attorney, Agent, or Firm* — Perkins Coie LLP; Michael A. Glenn

(57) ABSTRACT

Ferroelectric semiconductor device with a memory cell, with a ferroelectric memory layer and a first conductive layer disposed on the ferroelectric memory layer; and a semiconductor device connected to the memory cell. The ferroelectric memory layer of the memory cell can include a mixed crystal with a group III nitride and a non-group III element.

13 Claims, 14 Drawing Sheets

(51) Int. Cl.
*H01L 27/1159* (2017.01)
*H01L 21/28* (2006.01)
*H01L 29/51* (2006.01)

(58) Field of Classification Search
USPC .................................................... 257/295
See application file for complete search history.

(56) References Cited

U.S. PATENT DOCUMENTS

| | | | |
|---|---|---|---|
| 6,760,246 B1 | 7/2004 | Kamp et al. | |
| 8,304,823 B2 | 11/2012 | Boescke | |
| 9,449,972 B1 | 9/2016 | Flachowsky et al. | |
| 9,830,969 B2 | 11/2017 | Slesazeck et al. | |
| 10,497,866 B1* | 12/2019 | Fuller | G11C 7/1006 |
| 2006/0081901 A1* | 4/2006 | Arimoto | G11C 11/22 257/295 |
| 2009/0057737 A1* | 3/2009 | Boescke | H01L 28/91 257/295 |
| 2009/0261395 A1* | 10/2009 | Boescke | H01L 21/02194 257/295 |
| 2009/0267122 A1* | 10/2009 | Ohmi | H01L 21/02197 257/295 |
| 2010/0140589 A1* | 6/2010 | Ionescu | H01L 29/78391 257/295 |
| 2011/0049592 A1* | 3/2011 | Yoon | B82Y 10/00 257/295 |
| 2011/0241091 A1* | 10/2011 | Dubourdieu | H01L 29/40111 257/532 |
| 2012/0325639 A1* | 12/2012 | Scuderi | G06F 3/0445 200/600 |
| 2013/0270619 A1* | 10/2013 | Schloesser | H01L 29/6684 257/295 |
| 2014/0355328 A1* | 12/2014 | Muller | G11C 11/2275 257/295 |
| 2015/0214322 A1* | 7/2015 | Mueller | H01L 29/6684 257/532 |
| 2015/0340372 A1* | 11/2015 | Pandey | H01L 29/6684 257/295 |
| 2015/0357429 A1* | 12/2015 | Dubourdieu | H01L 29/513 257/295 |
| 2015/0380641 A1* | 12/2015 | Ino | C01G 27/00 257/295 |
| 2016/0005961 A1* | 1/2016 | Ino | H01L 45/146 257/295 |
| 2016/0111549 A1* | 4/2016 | Baars | H01L 21/28185 257/295 |
| 2016/0155748 A1* | 6/2016 | Li | H01L 29/7883 257/295 |
| 2016/0181259 A1* | 6/2016 | Van Houdt | G11C 11/2273 257/295 |
| 2016/0247932 A1* | 8/2016 | Sakai | H01L 21/02197 |
| 2017/0162250 A1* | 6/2017 | Slesazeck | G11C 11/2273 |
| 2018/0137905 A1* | 5/2018 | Nicholes | H01L 27/11502 |
| 2018/0366477 A1* | 12/2018 | Liu | G11C 11/221 |
| 2019/0074295 A1* | 3/2019 | Schröder | G11C 11/223 |
| 2019/0296122 A1* | 9/2019 | Ino | H01L 29/513 |
| 2020/0282484 A1* | 9/2020 | Heo | H01L 29/6684 |

OTHER PUBLICATIONS

Akiyama, Morito, et al., "Enhancement of piezoelectric response in scandium aluminum nitride alloy thin films prepared by dual reactive cosputtering", Adv. Mater. 21, 593-596 (2009), pp. 593-596.

Akiyama, Morito, et al., "Influence of growth temperature and scandium concentration on piezoelectric response of scandium aluminum nitride alloy thin films", Appl. Phys. Lett. 95, 162107 (2009), 4 pp.

Ambacher, O, et al., "Two-dimensional electron gases induced by spontaneous and piezoelectric polarization charges in N- and Ga-face AlGaN/GaN heterostructures", J. Appl. Phys. 85, 3222 (1999), 12 pp.

Bernardini, Fabio, et al., "Spontaneous polarization and piezoelectric constants of III-V nitrides", Phys. Rev. B 56, 24-27 (1997), 4 pp.

Böscke, T. S, et al., "Ferroelectricity in hafnium oxide thin films", Appl. Phys. Lett. 99, 102903 (2011), Sep. 8, 2011, 6 pp.

Caro, Miguel A, et al., "Piezoelectric coefficients and spontaneous polarization of ScAlN", J. Phys. Condens. Matter 27, 245901 (2015), May 2015, 16 pp.

Dawber, M, et al., "Physics of thin-film ferroelectric oxides", Review of Modern Physics 77, 1083-1130 (2005), pp. 1083-1130.

Dubois, Marc-Alexandre, et al., "Stress and piezoelectric properties of aluminum nitride thin films deposited onto metal electrodes by pulsed direct current reactive sputtering", Appl. Phys. 89, 6389 (2001), 7 pp.

Farrer, N, et al., "Properties of hexagonal ScN versus wurtzite GaN and InN", Phys. Rev. B 66, 201203 (2002), 4 pp.

Fichtner, Simon, et al., "Identifying and overcoming the interface originating c-axis instability in highly Sc enhanced AlN for piezoelectric micro-electromechanical systems", J. Appl. Phys. 122, 035301 (2017), 7 pp.

Fichtner, Simon, et al., "Stress controlled pulsed direct current co-sputtered Al1—xScxN as piezoelectric phase for micromechanical sensor applications", APL Mater. 3, 116102 (2015), 6 pp.

Gerber, P, et al., "Short-time piezoelectric measurements in ferroelectric thin films using a double-beam laser interferometer", Rev. Sci. Instrum. 74, 2613-2615 (2003), pp. 2613-2615.

Janssen, G. C. A. M, et al., "Celebrating the 100th anniversary of the Stoney equation for film stress: Developments from polycrystalline steel strips to single crystal silicon wafers", Thin Solid Films 517, 1858-1867 (2009), pp. 1858-1867.

Martin, Dominik, et al., "Ferroelectricity in Si-Doped HfO2 revealed: A binary lead-free ferroelectric", Adv. Mater. 26, 8198-8202 (2014), pp. 8198-8202.

Mayrhofer, P. M, et al., "Microstructure and piezoelectric response of YxAl1—xN thin films", Acta Mater. 100, 81-89 (2015), 2015, pp. 81-89.

Mertin, Stefan, et al., "Piezoelectric and structural properties of c-axis textured aluminium scandium nitride thin films up to high scandium content", Surf. Coatings Technol. 343, 2-6 (2018), 5 pp.

Meyer, René, et al., "Dynamic leakage current compensation in ferroelectric thin-film capacitor structures", Appl. Phys. Lett. 86, 142907 (2005), 3 pp.

Müller, J., et al., "Ferroelectric hafnium oxide: A CMOS-compatible and highly scalable approach to future ferroelectric memories", 2013 IEEE Int. Electron Devices Meet. 10.8.1-10.8.4 (2013), 6 pp.

Müller, J., et al., "Ferroelectric Hafnium Oxide Based Materials and Devices: Assessment of Current Status and Future Prospects", ECS J. Solid State Sci. Tech. (2015), 7 pp.

Muralt, P., et al., "Piezoelectric Thin Films for Sensors, Actuators, and Energy Harvesting", MRS Bull. 35, 658-664 (2009), pp. 658-664.

Piorra, A., et al., "Magnetoelectric thin film composites with interdigital electrodes", Appl. Phys. Lett. 103, 032902 (2013), 5 pp.

Prume, Klaus, et al., "Piezoelectric Thin Films: Evaluation of Electrical and Electromechanical Characteristics for MEMS Devices", IEEE Trans. Ultrason. Ferroelectr. Freq. Control 54, 8-14 (2007), pp. 8-14.

Setter, N., et al., "Ferroelectric thin films: Review of materials, properties, and applications", J. Appl. Phys. 100, 051606 (2006), 46 pp.

Shimizu, Takao, et al., "The demonstration of significant ferroelectricity in epitaxial Y-doped HfO2 film", Sci. Rep. 2016, 8 pp.

Sivaramakrishnan, S., et al., "Concurrent wafer-level measurement of longitudinal and transverse effective piezoelectric coefficients (d33,f and e31,f) by double beam laser interferometry", J. Appl. Phys. 123, 014103 (2018), 11 pp.

Tasnádi, Ferenc, et al., "Origin of the anomalous piezoelectric response in wurtzite ScxAl1—xN alloys", Phys. Rev. Lett. 104, 137601 (2010), 4 pp.

Tholander, Christopher, et al., "Ab initio calculations and experimental study of piezoelectric YxIn1—xN thin films deposited using reactive magnetron sputter epitaxy", Acta Mater. 105, 199-206 (2016), 12 pp.

(56) References Cited

OTHER PUBLICATIONS

Uehara, Masato, et al., "Giant increase in piezoelectric coefficient of AlN by Mg—Nb simultaneous addition and multiple chemical states of Nb", Appl. Phys. Lett. 111, 112901 (2017), 6 pp.

Warren, W. L, et al., "Voltage shifts and imprint in ferroelectric capacitors", Appl. Phys. Lett. 67, 866 (1996), 1996, 4 pp.

Zaghloul, Usama, et al., "Synthesis and characterization of 10nm thick piezoelectric AlN films with high c-axis orientation for miniaturized nanoelectromechanical devices", Appl. Phys. Lett. 104, 253101 (2014), 6 pp.

Zhang, Shujun, et al., "Piezoelectric materials for high power, high temperature applications", Mater. Lett. 59, 3471-3475 (2005), pp. 3471-3475.

Zhang, Siyuan, et al., "Tunable optoelectronic and ferroelectric properties in Sc-based III-nitrides", J. Appl. Phys. 114, 133510 (2013), 17 pp.

* cited by examiner

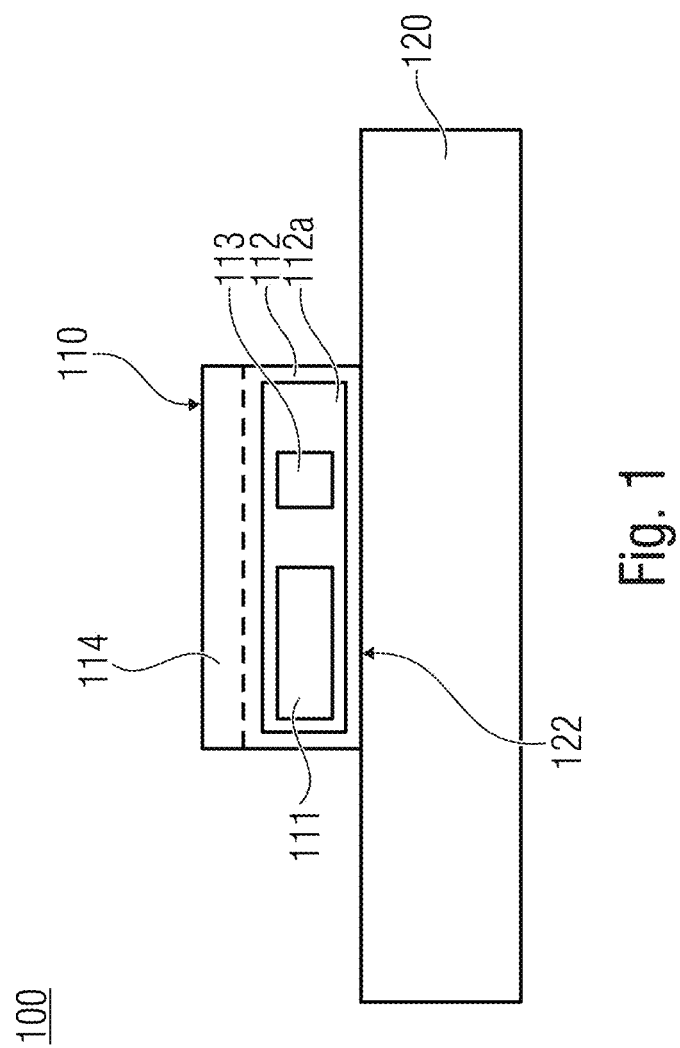

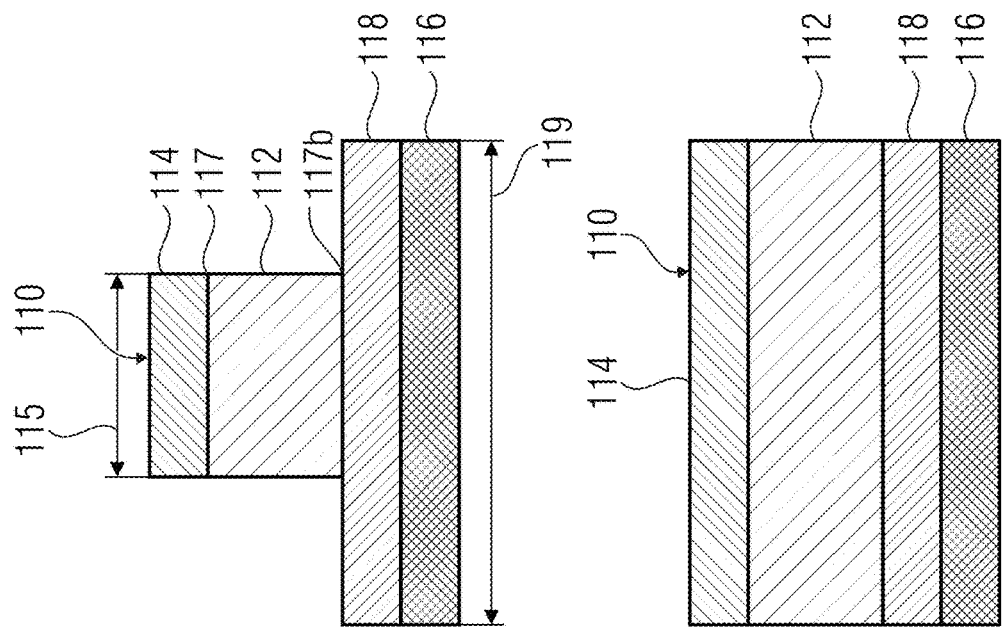
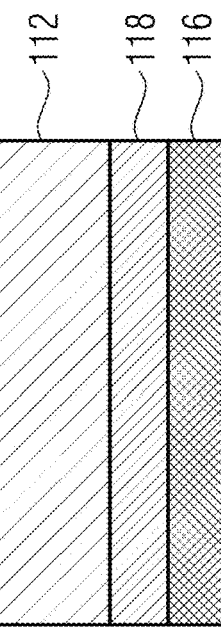
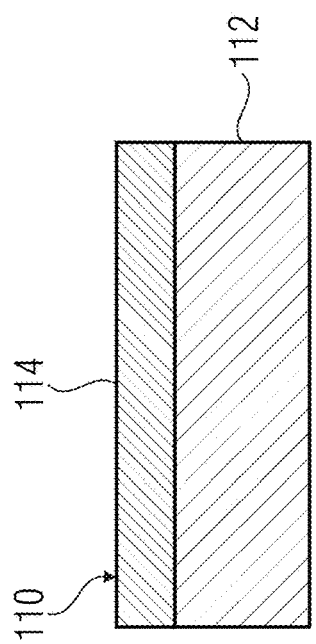
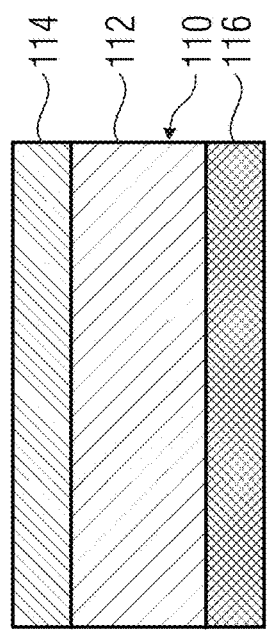
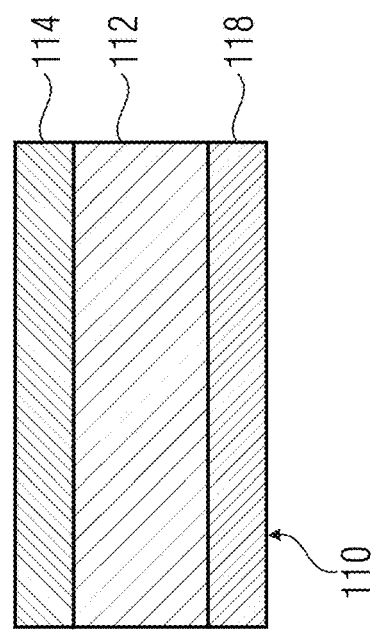

FERROELECTRIC SEMICONDUCTOR DEVICE AND METHOD FOR PRODUCING A MEMORY CELL

CROSS-REFERENCE TO RELATED APPLICATIONS

This application is a continuation of copending International Application No. PCT/EP2019/069963, filed Jul. 24, 2019, which is incorporated herein by reference in its entirety, and additionally claims priority from German Application No. 10 2018 212 736.0, filed Jul. 31, 2018, which is also incorporated herein by reference in its entirety.

Embodiments according to the invention relate to a ferroelectric semiconductor device and a method for producing a memory cell.

BACKGROUND OF THE INVENTION

Memory cells used in integrated circuits can be divided in volatile and non-volatile principles. As volatile elements, dynamic random access memories (DRAM) are to be mentioned. The same have a fast switching behavior and can be produced with very large density. However, an obvious disadvantage is that information is not stored permanently and is thus not available, e.g., after a restart of a device. However, conventional non-volatile media, which do not have this problem, have significantly slower switching times (time that is needed to write an information unit). In this context, electrically erasable programmable read-only memory (EEPROM) components are widely used. A group of components that could unite the advantages of both approaches are semiconductor devices with ferroelectric memory cells [31].

Industry and research have tried for a long period to realize ferroelectric memory cells based on perovskites such as lead zirconate titanate (PZT) or barium titanate (BTO). Significant obstacles, which have up to now prevented commercially successful components, are an unsatisfactory long-term stability as well as lack of compatibility with standard CMOS processes (CMOS=complementary metal-oxide-semiconductor). Especially the problem of a CMOS compatibility has since been solved by discovering hafnium oxide-based ferroelectrics [32, 33]. However, there is still potential for improvement by the usage of new ferroelectric materials, in particular with regard to long-term stability of the stored information even under difficult environmental conditions (e.g. at high temperatures).

The trend for miniaturization of piezoelectric sensors and actuators as well as the introduction of ferroelectric functionality into integrated circuit (IC) technology have resulted in a significant scientific and commercial interest in ferroelectric thin films [1-3]. Many of the more significant ferroelectrics are perovskite oxides having typical disadvantages such as low paraelectric transition temperatures, non-linear shifts or compatibility problems with the complementary metal-oxide semiconductor (CMOS) technology [2, 4].

SUMMARY

According to an embodiment, a ferroelectric semiconductor device may have: a memory cell with a ferroelectric memory layer and a first conductive layer disposed on the ferroelectric memory layer; and a semiconductor device connected to the memory cell, wherein the ferroelectric memory layer of the memory cell comprises a mixed crystal with at least one group III nitride and at least one non-group III element.

Another embodiment may have an integrated circuit with an inventive ferroelectric semiconductor device.

According to another embodiment, a method for producing a ferroelectric semiconductor device may have the steps of: producing a semiconductor device and forming a memory cell with a ferroelectric memory layer and a first conductive layer that is disposed on the ferroelectric memory layer; wherein the ferroelectric memory layer of the memory cell comprises a mixed crystal with a group III nitride and a non-group III element.

An embodiment relates to a ferroelectric semiconductor device with a memory cell that can comprise a ferroelectric memory layer and a first conductive layer that can be disposed on the ferroelectric memory layer and a semiconductor device that can be connected to the memory cell. The ferroelectric memory layer of the memory cell can comprise a mixed crystal having at least one group III nitride and at least one non-group III element.

According to an embodiment, the ferroelectric memory layer can have a first surface on which the first conductive layer is disposed. Thus, the ferroelectric memory layer is connected to the first conductive layer, for example, on the first surface. The memory cell can be connected to the semiconductor device such that the memory cell is disposed on the semiconductor device, represents part of the semiconductor device or is connected, for example, via an electrical connection.

This embodiment of the ferroelectric semiconductor device is based on the finding that by using the mixed crystal with the group III nitride and the non-group III element in the ferroelectric memory layer, high long-term stability of the stored information in the memory cell can be ensured even at high temperatures. Additionally, the mixed crystal can allow reliable storage of data with good scalability in the memory cell, since the mixed crystal can have a particularly stable and at the same time large electric polarization.

Thus, it has to be stated that the ferroelectric semiconductor device can provide reliable storage with good scalability and long-term stability of the stored information by combining the ferroelectric memory layer of the memory cell advantageously with the semiconductor device.

According to an embodiment, the memory cell can comprise an insulating layer, the ferroelectric memory layer and the first conductive layer that are disposed in this order; or the memory cell can comprise a second conductive layer, the ferroelectric memory layer and the first conductive layer that are disposed in this order; or the memory cell can comprise an insulating layer, a second conductive layer, the ferroelectric memory layer and the first conductive layer that are disposed in this order. Depending on the requirements, the memory cell of the ferroelectric semiconductor device can be adapted individually. Thus, due to the described layered structure, the memory cell can have a good scalability. Thus, the individual layers of the memory cell can have, for example, a very small layer thickness of more than 70 nm, more than 30 nm, more than 10 nm or more than 1.5 nm. Thus, the memory cell can be configured to ensure reliable storage, good scalability and long-term stability of the stored information in the memory cell.

According to an embodiment, the ferroelectric memory layer can have a more limited extension parallel to a surface of the first conductive layer than the insulating layer and/or the second conductive layer. The surface of the first conductive layer can represent the surface by which the first conductive layer is disposed on the ferroelectric memory layer. Thus, the surface of the first conductive layer can represent a connecting surface between the ferroelectric memory layer and the first conductive layer. In other words, the ferroelectric memory layer can have an extension parallel to the surface of the first conductive layer such that the insulating layer and/or the second conductive layer can project beyond the ferroelectric memory layer. The extension can be selected such that the charge applied to the ferroelectric memory layer and/or the second conductive layer does not load the insulating layer with an electric voltage above its breakdown voltage. Thus, the memory cell ensures, e.g., reliable storage and long-term stability of the stored information.

According to an embodiment, the memory cell can have a U-shape, an O-shape, a cylindrical shape or a cuboid shape. Here, the U-shape or the O-shape can have, for example, sharp edges or rounded edges. Thus, depending on the requirements or depending on the semiconductor device, an individual configuration of the memory cell is ensured. Depending on the semiconductor device, a matching memory cell can be connected to the semiconductor device. Thus, good scalability of the ferroelectric semiconductor device with the memory cell is obtained based on the individual shape of the memory cell that can be adapted to the semiconductor device, an optimum connection between the semiconductor device and the memory cell can be obtained, whereby reliable storage and long-term stability of the stored information in the ferroelectric semiconductor device can be obtained. Additionally, by the specific shape of the memory cell, a switching behavior of the ferroelectric semiconductor device can be very fast and efficient.

According to an embodiment, the group III nitride of the mixed crystal of the ferroelectric memory layer can comprise AlN, GaN, InN or a combination thereof, such as AlGaN, AlInN, GaInN or AlGaInN. The mixed crystal based on the group III nitride can comprise a polarization whose amount can reach values of more than 50 $\mu C/cm^2$, 80 $\mu C/cm^2$ or more than 100 $\mu C/cm^2$. If the semiconductor device comprises, for example, an FET (e. g. a planar MOSFET, an HEMT, a FinFET, etc.), the memory cell with a mixed crystal having the above-described group III nitrides can ensure particularly efficient opening and closing of an FET channel. The combination of FET and ferroelectric memory cell can be referred to as FeFET. For this, the memory cell can form at least one part of a gate structure of the semiconductor device. If the semiconductor device comprises, for example, a RAM cell, the memory cell with the mixed crystal having the above-described group III nitrides can ensure a particularly large difference of a read-out current of the RAM cell. For this, the memory cell can form, for example, at least part of the capacitor structure of the semiconductor device. Additionally, the group III nitrides can comprise crystallization with correct orientation already at the first nanometers, which allows good scalability towards layers that are as thin as possible.

According to an embodiment, the non-group III elements can comprise a transition metal or Mg. Thus, the non-group III element can be, for example, Sc, Y, Nb, Ti or Mg. The non-group III elements can ensure ferroelectricity of the mixed crystal of the memory cell. By the specific material combination of the mixed crystal of the memory cell with the non-group Ill element, the mixed crystal can have relevant ferroelectric characteristics even at temperatures of more than 200° C., 400° C. or 600° C. Additionally, a polarization of the mixed crystal can be maintained over a long period without measurable attenuation.

According to an embodiment, non-group III elements can occupy 20 to 50% of the spaces of group III atoms of the group III nitrides within the mixed crystal of the memory cell. Alternatively, the non-group III elements can occupy 25 to 45% or 27 to 43% of the spaces of group III atoms of the group III nitrides within the mixed crystal. Due to the specific relationship between the non-group III elements and the group III atoms, a ferroelectric characteristic of the ferroelectric memory layer can be ensured. An increasing content of non-group III elements within the mixed crystal can reduce a coercive field. Thereby, a polarization of the ferroelectric memory layer with a coercive field lower than a breakdown field of the mixed crystal can be re-oriented. An average field where this re-orientation takes place can be referred to as coercive field. Thus, for example, with the help of ferroelectricity, reliable storage is enabled. With the specific structure of the mixed crystal (connection of group III elements with the group III nitrides), good scalability can be ensured and with the specific material combination of the mixed crystal, additionally, long-term stability of the stored information can be ensured.

According to an embodiment, the semiconductor device can include an FeFET and the memory cell can form at least part of a gate structure of the semiconductor device. Here, a switchable electric polarization of the ferroelectric memory layer of the memory cell can, depending on the orientation, close or open a source/drain channel of the FeFET. Thus, a ferroelectric semiconductor device that enables very fast storage of information can be provided. A further advantage is a long-term stability of the stored information.

According to an embodiment, the FeFET can be a planar MOSFET (metal-oxide semiconductor field-effect transistor), a FinFET or an HEMT (high electron mobility transistor). Thus, the advantages of a ferroelectric memory cell can be used in numerous variations of the FeFET. The individual variations (planar MOSFET, FinFET or HEMT) can hence contribute to very fast and long-term stable storage of information by the ferroelectric semiconductor device.

According to an embodiment, the semiconductor device can include an FeRAM and the memory cell can form at least part of a capacitor structure or a gate structure of the semiconductor device. If the memory cell forms, for example, part of the capacitor structure, depending on the original state of a polarization of the memory cell, a current varying during a reading operation of the semiconductor device can flow. Thus, reliable storage and long-term stability of the stored information is ensured. If the memory cell forms at least part of the gate structure of the semiconductor device, the semiconductor device can have the same or similar functionalities as already described above with respect to the FeFET.

One embodiment relates to an integrated circuit with a ferroelectric semiconductor device. Thus, an integrated circuit can be provided that ensures reliable storage, good scalability and long-term stability of the stored information.

One embodiment provides a method for producing a ferroelectric semiconductor device. The method can comprise producing a semiconductor device and forming a memory cell with a ferroelectric memory layer and a first conductive layer that is disposed on the ferroelectric memory layer. The ferroelectric memory layer of the memory cell can comprise a mixed crystal with a group III nitride and a non-group III element. The memory cell can be connected to the semiconductor device.

According to an embodiment, forming the memory cell can comprise forming the ferroelectric memory layer by means of reactive deposition on the semiconductor device and forming the first conductive layer on the ferroelectric memory layer.

BRIEF DESCRIPTION OF THE DRAWINGS

Embodiments of the present invention will be detailed subsequently referring to the appended drawings, in which:

FIG. 1 is a schematic illustration of a ferroelectric semiconductor device according to an embodiment of the present invention;

FIG. 2a is a schematic illustration of a memory cell for a ferroelectric semiconductor device according to an embodiment of the present invention;

FIG. 2b is a schematic illustration of a memory cell with an insulating layer for a ferroelectric semiconductor device according to an embodiment of the present invention;

FIG. 2c is a schematic illustration of a memory cell with a second conductive layer for a ferroelectric semiconductor device according to an embodiment of the present invention;

FIG. 2d is a schematic illustration of a memory cell with a second conductive layer and an insulating layer for a ferroelectric semiconductor device according to an embodiment of the present invention;

FIG. 2e is a schematic illustration of a memory cell with a ferroelectric memory layer comprising a more limited extension parallel to a surface of a first conductive layer than an insulating layer and/or a second conductive layer, for a ferroelectric semiconductor device according to an embodiment of the present invention;

DETAILED DESCRIPTION OF THE INVENTION

Figure 3:
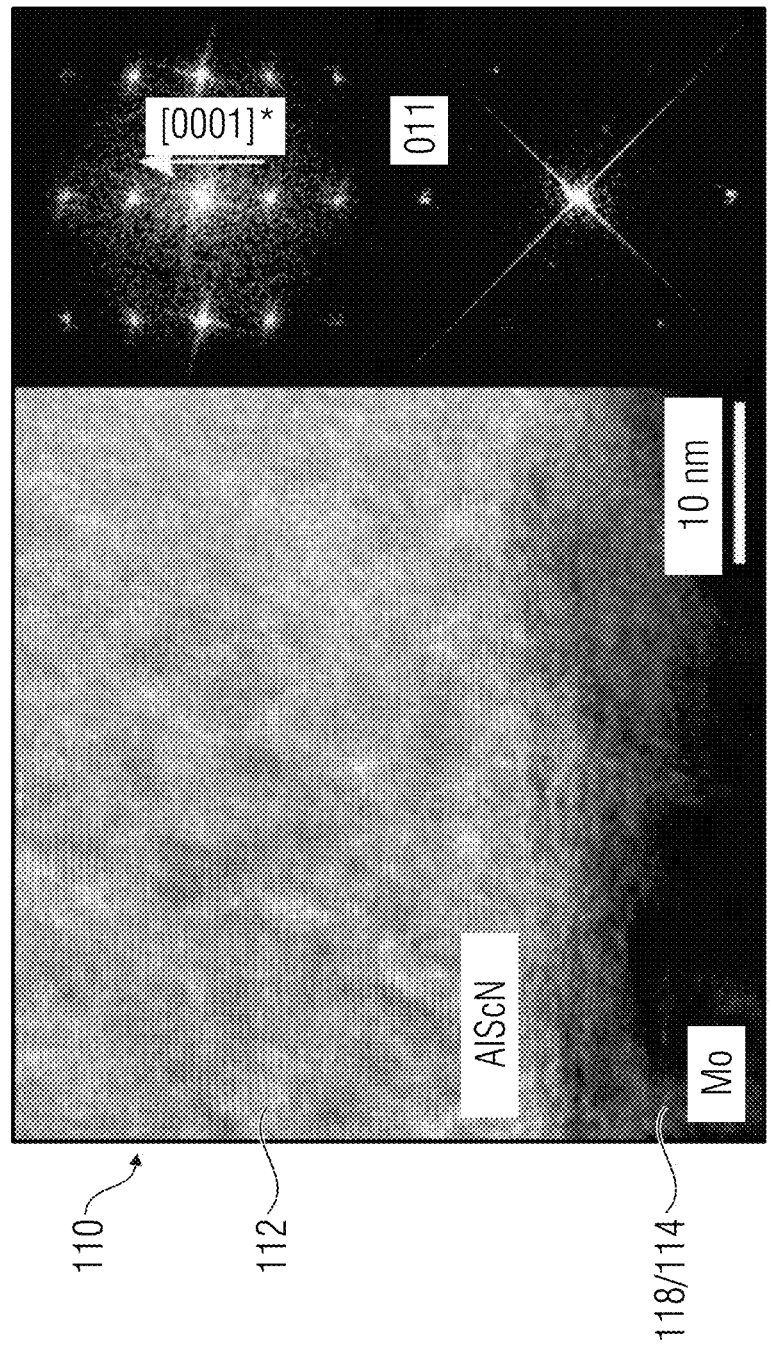
FIG. 3 is a schematic illustration of a transmission electron microscopy of a memory cell for a ferroelectric semiconductor device according to an embodiment of the present invention.

Before embodiments of the present invention will be discussed below in detail based on the drawings, it should be noted that identical, functionally equal or equal elements, objects and/or structures are provided with the same or similar reference numbers in the different figures, such that the description of these elements illustrated in the different embodiments is inter-exchangeable or inter-applicable.

FIG. 1 shows a schematic illustration of ferroelectric semiconductor device 100 with a memory cell 110 and a semiconductor device 120 connected to the memory cell 110. The memory cell 110 can comprise a ferroelectric memory layer 112 and a first conductive layer 114 disposed on the ferroelectric memory layer 112. The ferroelectric memory layer 112 of the memory cell 110 can comprise a mixed crystal 112a with a group III nitride 111 and a non-group III element 113. Thus, the ferroelectric semiconductor device 100 can comprise a first group III nitride-based ferroelectric in the ferroelectric memory layer 112.

The complete ferroelectric memory layer 112 can comprise, for example, the mixed crystal 112a. Here, it should be noted that FIG. 1 is only a schematic illustration. Even when the group III nitride 111 and the non-group III element 113 are illustrated spatially separate from one another in FIG. 1, this is not the case in reality. In the mixed crystal 112a, for example, a chemical compound of the group III nitride with the non-group III element is distributed homogenously. In that way, the group III nitride and the non-group III element can form a compound with one another in the mixed crystal 112a. The mixed crystal 112a can comprise, for example, AlScN, GaScN, InScN, AlNbMgN, GaNbMgN, InNbMgN, AlGaNbMgN, etc.

According to FIG. 1, the memory cell 110 can be disposed on the semiconductor device 120 such that the same are connected to one another via a connecting surface 122.

According to an embodiment, the memory cell 110 can comprise a U shape, an O shape, a cylindrical shape or a cuboid shape. Thus, depending on the semiconductor device 120, an individually adapted memory cell 110 can be connected to the semiconductor device 120.

According to an embodiment, the group III nitride 111 of the mixed crystal 112a of the ferroelectric memory layer 112 can comprise AlN, GaN, InN or a combination thereof. A combination can be, for example, AlGaN, AlInN or GaInN.

According to an embodiment, the non-group III element 113 can comprise a transition metal or Mg. Thus, the non-group III element can be, for example, Sc, Y, Nb, Mg or Ti.

It should be noted that the mixed crystal 112a can comprise a plurality of group III nitrides 111 and a plurality of non-group III elements 113. Here, the group III nitrides 111 can form chemical compounds with the non-group III elements 113 to form the mixed crystal 112a.

According to an embodiment, the non-group III elements 113 can occupy 20 to 50% of the spaces of group III atoms of the group III nitrides 111 within the mixed crystal 112a. Here, the group III atoms can, for example, be Al, Ga or In. In other words, the 20 to 50% represent a portion of the non-group III elements 113 with respect to the group III atoms of the group III nitrides 111 in the mixed crystal 112a. The portion of the non-group III elements 113 can be selected such that the ferroelectric memory layer 112 comprises ferroelectric characteristics. This is based on the knowledge that, under specific conditions, the mixed crystal 112a based on group III nitrides 111 (GaN, AlN, InN) can be ferroelectric. Whether ferroelectricity can be observed can depend on the admixture of individual or several metals (an example for a non-group III element 113, such as Sc, Y, Nb, Ti, Mg, etc.) and on mechanical stress within the ferroelectric memory layer 112.

According to an embodiment, the mechanical stress of the ferroelectric memory layer 112 can be selected such that the ferroelectric memory layer 112 comprises ferroelectric characteristics. The mechanical stress of the ferroelectric memory layer 112 can be within an interval of −500 MPa to 2000 MPa, −300 MPa to 1000 MPa or of −250 MPa to 500 MPa.

An advantage of the described approach with group III nitrides 111 is the amount of polarization of the ferroelectric memory layer 112. The same can reach values of more than 100 µC/cm², which can be significantly more than almost all alternative ferroelectrics, such as PZT, BTO and hafnium oxide-based compounds.

According to an embodiment, the semiconductor device 120 can comprise an FET, e.g. a planar MOSFET, a FinFET or an HEMT, etc. The ferroelectric memory cell 110 can be part of the gate structure of the FET, the same can hence correspond to an FeFET. The high polarization of the ferroelectric memory layer 112 of the memory cell 110 can ensure particularly efficient opening and closing of an FET channel.

According to an embodiment, the semiconductor device 120 can comprise an RAM. The memory cell 110 can form part of a capacitor structure of the semiconductor device. The high polarization of the ferroelectric memory layer 112 of the memory cell 110 can ensure a particularly large difference of a read-out current of an FeRAM cell.

The material (e.g. the mixed crystal 112a) of the ferroelectric memory layer 112 can be crystallized already on the first nanometers, starting from a substrate (the substrate can, for example, include the first conductive layer 114, a second conductive layer, an insulating layer or the semiconductor device 120) in a ferroelectric crystal structure (wurtzite structure) which can form the mixed crystal 112a, and can have a correct orientation. Thus, good scalability towards layers that are as thin as possible (e. g. the ferroelectric memory layer 112) is ensured, which enables a high density of memory cells 110.

According to an embodiment, the mixed crystal 112a of the ferroelectric memory layer 112 can comprise a high coercive field smaller than a breakdown voltage of the mixed crystal 112a. The high coercive field, which can additionally be adjusted by a composition (e. g. of the group III nitride 111 and the non-group III element 113) and the mechanical stress can ensure that, in particular at a very low layer thickness (a few nanometers) of the ferroelectric memory layer 112, attractive electric threshold voltages of few volts can be obtained for storing information.

One advantage of the ferroelectric memory layer 112 is that the mixed crystal 112a can be deposited at low deposition temperatures (usually 300° C. to 400° C., 310° C. to 390° C. or 320° C. to 380° C.), which enables deposition of the mixed crystal 112a (e. g. the ferroelectric materials) also after a final doping diffusion step, and usage of the same in a CMOS-compatible manner.

Thus, it has to be stated that the new group III nitride 111-based memory cells 112 enable a significantly more reliable storage of data with good scalability than conventional technology. This can be a direct consequence of the particularly stable and at the same time large electric polarization in the described material class (e. g. the group III nitride-based mixed crystals). By the obtained reliability of the ferroelectric semiconductor device 100 at high temperatures, non-volatile ferroelectric memories (such as the ferroelectric semiconductor device 100) may also be used, e. g. in direct proximity to combustion engines or power units.

According to an embodiment, the ferroelectric memory layer 112 can resist high temperatures due to its specific material composition of group III nitrides 111 and non-group III elements 113. Thus, the ferroelectric memory layer 112 can be subject, for example, to temperatures of more than 400° C., 500° C. or 600° C. without suffering a significant degradation of characteristics of the ferroelectric memory layer 112.

In the subsequent Table 1, characteristics of the ferroelectric memory layer 112 with the mixed crystal 112 are contrasted with alternative ferroelectric materials, such as, e. g., PZT and $HfO_2$. For this, a specific example is selected for the mixed crystal 112a, which, for the group III nitride 111 is AlN and the non-group III element 113 is Sc. Thus, the mixed crystal 112a can have a chemical compound between the group III nitride 111 and the non-group III element 113, which can be illustrated as $Al_{1-x}Sc_xN$. Here, the index x can have a number between 0 and 1 and can represent the portion of the non-group III element 113 (in this case, e. g. Sc) of the group III nitride 111 (in this case, e. g. AlN). The values for PZT and $HfO_2$ have been taken from reference [35].

TABLE 1

| Characteristic | PZT | Fe—HfO$_2$ | Fe—Al$_{1-x}$Sc$_x$N |
|---|---|---|---|
| Layer thickness | >70 nm | 5-30 nm | <10 nm to >1000 nm |
| Annealing/deposition temperature | >600° C. | 450° C.-1000° C. | <400° C. |
| Remanence polarization | 20-40 μC/cm$^2$ | 1-40 μC/cm$^2$ | 60-110 μC/cm$^2$ |
| Coercive field strength | ~50 kV/cm | 1-2 MV/cm | 1.8-4 MV/cm |
| Breakdown field strength | 0.5-2 MV/cm | 4-8 MV/cm | >4 MV/cm |
| CMOS compatibility | Pb and O diffusion | given | given |
| BEOL compatibility | Damages by H$_2$ | given | given |
| Maximum operating temperature | 100-200° C. | 300-400° C. | >600° C. |

FIG. 2a to FIG. 2d show different embodiments of a memory cell 110 with a first conductive layer 114 and a ferroelectric memory layer 112. The first conductive layer 114 can be disposed on the ferroelectric memory layer 112. The ferroelectric memory layer 112 of the memory cell 110 can have a mixed crystal with a group III nitride and a non-group III element.

According to an embodiment, the ferroelectric memory layer 112 can consist of group III elements, such as Al, Ga or In or combinations thereof, nitrogen N as well as a non-group III element, such as a metal, Sc, Mg, Nb, Y, Ti or combinations thereof. Here, the group III element and the nitrogen can form the group III nitride. The portion of the additional non-group III element (e. g. metal or metals) as well as mechanical stress can be adjusted during a production process such that the material (e. g. a ferroelectric memory layer 112) becomes ferroelectric. The mechanical stress can also be adjusted afterwards, e. g. by depositing additional layers.

According to an embodiment, the first conductive layer 114 can comprise, e. g. a metal such as Pt, Cr, Au, Ti, Al, Cu, Mo or an alloy or a multilayer system. The first conductive layer 114 can also be made of a semiconductor that can be doped accordingly (e. g. Si, Ga, GaN, SiC) or can also comprise, e. g. TiN or TiAlN.

According to an embodiment, the memory cell 110, see, e. g. FIG. 2b, can comprise an insulating layer 116, the ferroelectric memory layer 112 and the first conductive layer 114 that are disposed in that order. The insulating layer 116 can consist, e. g. of SiO$_2$, HfO$_2$, Al$_2$O$_3$, AlN, GaN or mixed crystals based thereon. The insulating layer 116 can be, for example, a gate dielectric used as standard in the semiconductor industry.

According to an embodiment, the memory cell 112 can comprise, such as in FIG. 2c, a second conductive layer 118, the ferroelectric memory layer 112 and the first conductive layer 114 that are disposed in that order. The first conductive layer 114 as well as the second conductive layer 118 can comprise, for example, the same material or two different materials. The first conductive layer 114 as well as the second conductive layer 118 can comprise the same features and functionalities as the first conductive layer 114 of FIG. 2a.

According to an embodiment, the memory cell 110 can comprise, such as in FIG. 2d, an insulating layer 116, a second conductive layer 118, the ferroelectric memory layer 112 and the first conductive layer 110 that are disposed in this order. Here, for example, the second conductive layer 118 can have the same features and functionalities as the second conductive layer 118 of FIG. 2c, and the insulating layer 116 the same features and functionalities as the insulating layer 116 of FIG. 2b.

According to an embodiment, the memory cell 110, such as illustrated in FIG. 2e can have the same layer structure as shown in FIG. 2d only that the ferroelectric memory layer 112 can have a more limited extension (e. g. a first extension 115 and a second extension perpendicular to the extension 115 into the level of the sheet) parallel to a surface 117 of the first conductive layer 114 than the insulating layer 116 and the second conductive layer 118. The insulating layer 116 and the second conductive layer 118 comprise, for example, a first extension 119 greater than the first extension 115 of the ferroelectric memory layer 112. Here, it should be noted that also a second extension of the insulating layer 116 perpendicular to the first extension 119 into the level of the sheet can be greater than the second extension of the ferroelectric memory layer 112.

According to an embodiment, also the ferroelectric memory layer 112 of the memory cell 110 having a layer structure according to FIG. 2b or FIG. 2c can have a more limited extension than the insulating layer 116 (see FIG. 2b) or the second conductive layer 118 (see FIG. 2c) parallel to a surface of the first conductive layer 114.

The surface 117 (see FIG. 2e) connects, for example, the first conductive layer 114 to the ferroelectric memory layer 112. In other words, the first conductive layer 114 can comprise the surface 117 that can be disposed on the ferroelectric memory layer 112. According to an embodiment, illustrated in FIG. 2e, the insulating layer 116 and optionally the second conductive layer 118 can project beyond the ferroelectric memory layer 112.

According to an embodiment, a surface 117b of the ferroelectric memory layer 112, parallel to the surface 117 of the first conductive layer 114, can be adapted such that, for example, the insulating layer 116 is not loaded with an electric voltage above its breakdown voltage by a charge applied to the ferroelectric memory layer 112. This can particularly be the case when the ferroelectric memory layer 112 comprises, for example, a large polarization that can be accompanied by many charges at interfaces which can result in excessive voltages at the insulating layer.

FIG. 3 shows a transmission electron microscopy image of a memory cell 110. According to an embodiment, the memory cell 110 can comprise a conductive layer 118/114 and a ferroelectric memory layer 112. According to an explicit example, the ferroelectric memory layer 112 can comprise the mixed crystal Al$_{0.73}$Sc$_{0.27}$N with a group III nitride AlN and a non-group III element Sc. According to an explicit example, the conductive layer 118/114 can comprise a molybdenum electrode.

An analysis of the structure of the memory cell 110 can result in a directional crystalline growth already on the first 10 nm. An axis of the electric polarization of the ferroelectric memory layer 112 can be perpendicular to the substrate (e. g. the conductive layer 118/114). In other words, the material (e. g. $Al_{0.73}Sc_{0.27}N$) of the ferroelectric memory layer 112 is already crystallized in a ferroelectric crystal structure (wurtzite structure) on the first nanometers starting from the substrate and has a correct orientation.

Figures 4A, 4B:
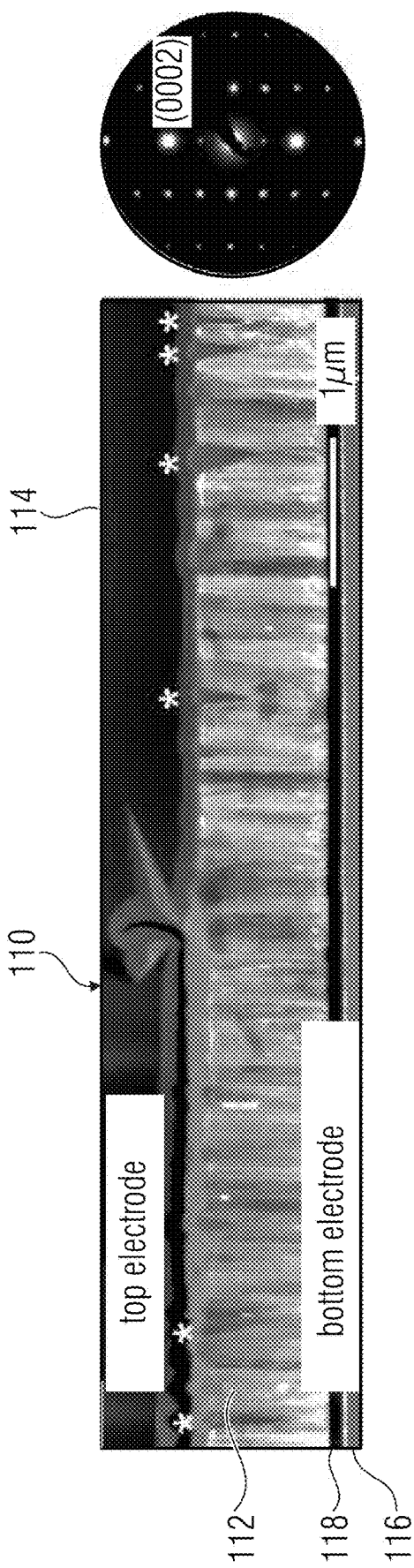
FIG. 4a is a schematic illustration of a transmission electron microscopy of a memory cell with a second conductive layer for a ferroelectric semiconductor device according to an embodiment of the present invention.
FIG. 4b is a schematic illustration of an electron diffraction image of a lattice structure of a mixed crystal of a memory cell for a ferroelectric semiconductor device according to an embodiment of the present invention.

FIG. 4a shows a schematic TEM dark field image (TEM=transmission electron microscopy) that outlines an intensity of a (0002) reflection of a memory cell 110 for a ferroelectric semiconductor device, which can be indicated in the PED image (precision electron diffraction), see FIG. 4b. Wrongly oriented crystals that do not show the wurtzite (0002) texture of the matrix can be shown with a darker contrast in the lighter crystal matrix and can partly be indicated by (*).

FIG. 4a and FIG. 4b can illustrate an explicit example of the memory cell 110. Thus, a ferroelectric memory layer 112 can comprise, for example, $Al_{0.57}Sc_{0.43}N$. To examine the structural integrity of the $Al_{1-x}Sc_xN$ film (x can represent a number between 0 and 1) with respect to a polarization inversion, a microstructure of the $Al_{0.57}Sc_{0.43}N$ film (the ferroelectric memory layer 112) can be examined by transmission electron microscopy (TEM). The TEM sample (memory cell 110) has been prepared such that the same includes two regions: one (e. g. the ferroelectric memory layer 112) that can be disposed between Pt electrodes (e. g. between a first conductive layer 114 and a second conductive layer 118) and can be subject to ferroelectric polarization inversion, and an unamended region 116 to allow structural comparison. An illustration of attached TEM dark field images outlining the intensity of the wurtzite $Al_{0.57}Sc_{0.43}N$ (0002) reflection is given in FIG. 4a with a precession electron diffraction, PED, image of the wurtzite structure in FIG. 4b. No significant difference regarding the contrast between crystal columns (e. g. the ferroelectric memory layer 112) below the Pt top electrode (e. g. the first conductive layer 114) used for polarization inversion and crystal columns (e. g. the region 116) that are not subject to a switching electric field could be observed, wherein the electric field can be caused by the first conductive layer 114 and the second conductive layer 118.

Due to a high Sc content (according to the example 43%) of the specific sample (memory cell 110), a number of wrongly oriented wurtzite grains has been identified, some of which are indicated by stars in FIG. 4a. Above that, structural variations in the form of potential cuboid grains and a non-identified phase have sometimes been observed.

However, it has to be noted that the majority of the film (the ferroelectric memory layer 112) has been identified as (0002) texturized $Al_{1-x}Sc_xN$ in ED experiments, both in the original region as well as in the region with polarization inversion, and these structural variations have merely been observed randomly and only have very little volume fractions. Thus, the ferroelectric behavior of $Al_{1-x}Sc_xN$ can actually only be related to the wurtzite structure.

Figure 5:
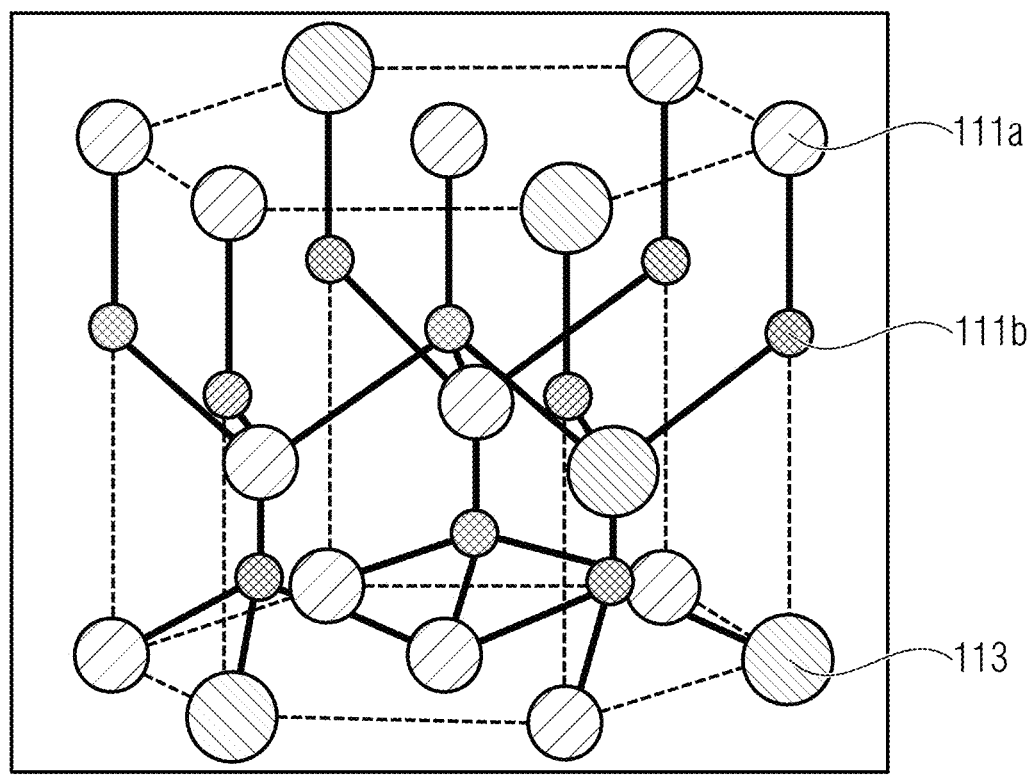
FIG. 5 is a schematic illustration of a mixed crystal of a memory cell for a ferroelectric semiconductor device according to an embodiment of the present invention.

FIG. 5 shows a schematic illustration of a mixed crystal 112a of a memory cell for a ferroelectric semiconductor device according to an embodiment of the present invention. The mixed crystal 112a can comprise a group III nitride consisting, for example, of a group III atom 111a and nitrogen N 111b and a non-group III element 113. Considered non-stoichiometrically, the mixed crystal according to FIG. 5 comprises, for example, 12 group III atoms 111a, 10 nitrogen N 111b and 5 non-group III elements 113. Considered stoichiometrically, a number of nitrogen atoms N 111b and the other elements (e. g. group III atoms 111a and non-group III elements 113) can be equal (atoms at the corners of the cell are, for example, not counted fully). The mixed crystal 112a illustrated in FIG. 5 can be continued periodically.

According to an embodiment, the non-group III elements 113 can occupy 20 to 50% of the spaces of group III atoms 111a of the group III nitrides within the mixed crystal 112a. Thus, for example, in FIG. 5, the non-group III elements 113 occupy 29% of the spaces of group III atoms 111a. Due to the specific composition of the mixed crystal 112a, the mixed crystal 112a can have ferroelectric characteristics.

According to an embodiment, the mixed crystal 112a of FIG. 5 can represent a section of a ferroelectric memory layer of a memory cell for a ferroelectric semiconductor device and can be continued in all three spatial directions with the crystal structure.

Figure 6:
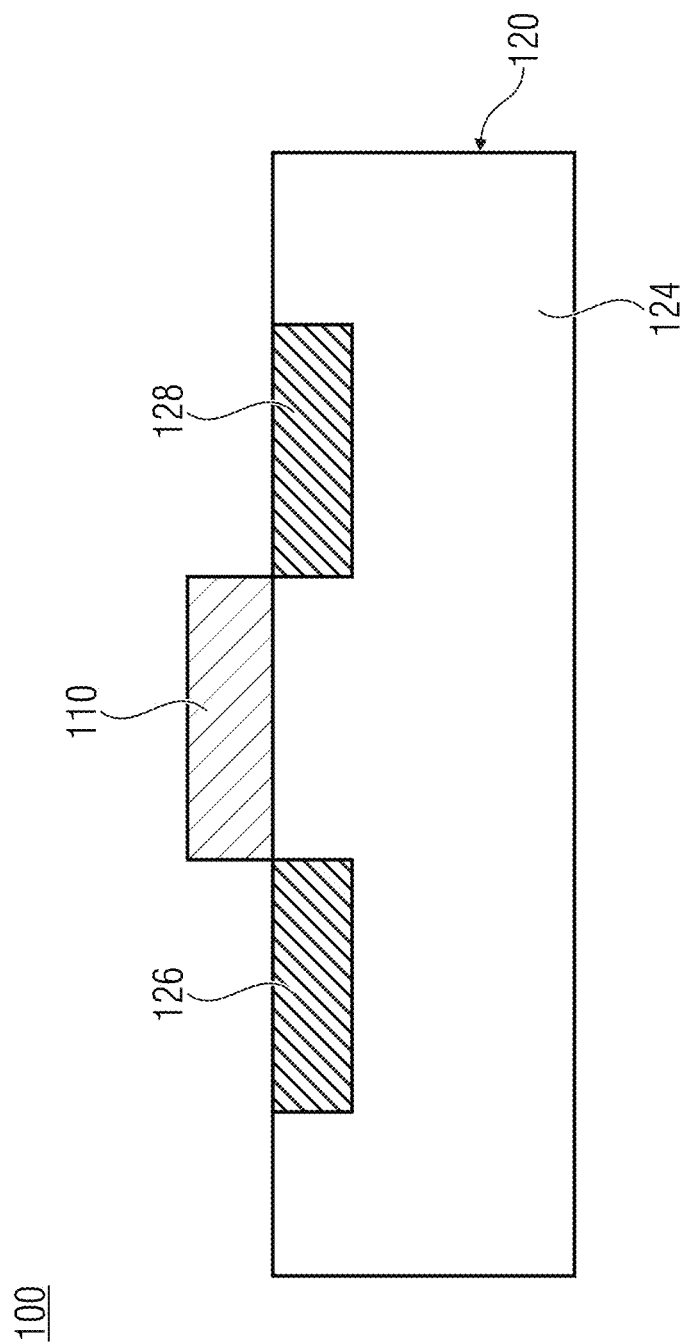
FIG. 6 is a schematic illustration of a ferroelectric semiconductor device, wherein a semiconductor device includes an FeFET, according to an embodiment of the present invention.

FIG. 6 shows a schematic illustration of a ferroelectric semiconductor device 100 according to an embodiment of the present invention. The ferroelectric semiconductor device 100 can comprise a memory cell 110 with a ferroelectric memory layer and a first conductive layer disposed on the ferroelectric memory layer. Further, the ferroelectric semiconductor device 100 can comprise a semiconductor device 100 that can be connected to the memory cell 110. According to FIG. 6, the semiconductor device 120 can be connected to the memory cell 110 such that the memory cell 110 is disposed on the semiconductor device 120. The memory cell 110 can be configured, for example, according to the memory cell 110 illustrated in FIGS. 2a to 2e. Accordingly, the memory cell 110 can have the same features and functionalities as the memory cell 110 in FIG. 1 or FIG. 2a to FIG. 2d.

According to an embodiment, the semiconductor device 120 can include an FET. Here, the memory cell 110 can form, for example, at least part of a gate structure of the semiconductor device 120. Thus, the memory cell 110 can also be referred to as gate stack.

According to an embodiment, the semiconductor device 120 can comprise a substrate 124, a first terminal 126 and a second terminal 128, wherein the first terminal 126 and the second terminal 128 can form a source/drain. The substrate 124 can comprise, e. g. silicon, silicon carbide (SiC), germanium or group III nitrides (such as AlN, GaN, InN) and can be doped. The FeFET (e. g. the semiconductor device 120) can also be referred to as ferroelectric 1T memory cell or as ferroelectric field-effect transistor.

According to an embodiment, in an FeFET as illustrated in FIG. 6, a ferroelectric (e. g. the ferroelectric memory layer of the memory cell 110) can be disposed directly above the gate of the semiconductor device 120 or can merely be separated from the gate of the semiconductor device 120 by a thin dielectric (e. g. an insulating layer) and/or additional thin layers (e. g. a second conductive layer). Depending on the orientation, a switchable electric polarization of ferroelectric material (e. g. the ferroelectric memory layer of the memory cell 110) can close or open, a source-drain-channel of the semiconductor device 120 (e. g. a transistor (1T)) very fast. Thus, the ferroelectric semiconductor device 100 can unite advantages of non-volatile and volatile memory technologies.

In other words, the memory cell 110 can be configured to control the semiconductor device 120 based on information stored in the memory cell 110. The stored information are, for example, a polarization orientation of the memory cell. Thus, according to an embodiment, the memory cell 110 is configured to put the semiconductor device 120 either into an on-state or an off-state, based on the information stored in the memory cell 110. This means, for example, that an electric channel (i.e. the source-drain channel) between the first terminal 126 (e. g. source) and the second terminal 128 (e. g. drain) is opened or closed. In other words, in the on-state, the semiconductor device 120 can have a conductivity of more than or equal to an upper threshold, and in the off-state, the same can have a conductivity of less than or equal to a bottom threshold. The stored information in the memory cell 110 causes a more conductive (e. g. on-state) or less conductive or non-conductive (e. g. off-state) state of the semiconductor device 120.

Thus, according to an embodiment, not only information for some applications are stored in the memory cell 110, but, e. g., a state of the FeFET (e. g. the semiconductor device 120) is permanently put in an on-state or off-state by the ferroelectric layer (the memory cell 110) (i.e. permanently until the ferroelectric material of the memory layer 110 is switched again). Thus, storing information is not the ultimate goal of the application. In this case, the ferroelectric material stores, e. g. the desired state of the transistor (e. g. the semiconductor device 120). At the same time, e. g. the polarization of the ferroelectric layer effects exactly this state.

Figure 7:
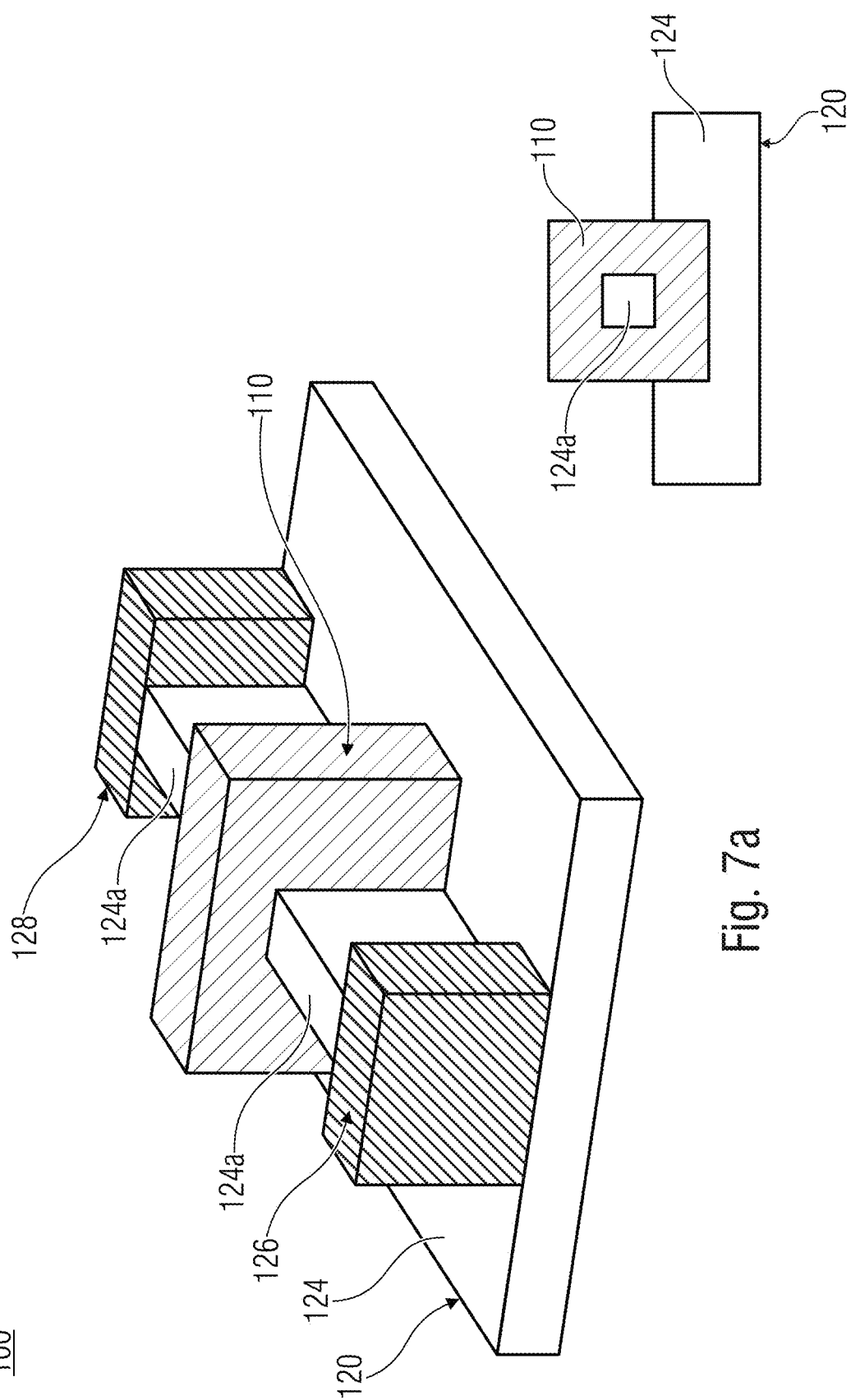
FIG. 7a is a schematic illustration of a ferroelectric semiconductor device, wherein the semiconductor device includes an FinFET with U-shaped memory cell, according to an embodiment of the present invention.
FIG. 7b is a schematic illustration of a ferroelectric semiconductor device, wherein a semiconductor device includes an FinFET with O-shaped memory cell, according to an embodiment of the present invention.

This advantageous feature of the switchable semiconductor device 120 by means of the memory cell 110 is not only suitable for the FeFET illustrated in FIG. 6. Alternatively, a planar MOSFET, a FinFET (such as illustrated in FIG. 7a or 7b) or an HEMT can have this feature.

The FeFET can comprise functions and features according to [31].

FIG. 7a shows a schematic illustration of a ferroelectric semiconductor device 100 with a memory cell 110 and a semiconductor device 120 connected to the memory cell 110. According to an embodiment, the semiconductor device 120 can be a FinFET. According to an embodiment, the semiconductor device 120 can comprise a substrate 124 with a fin 124a. Additionally, the semiconductor device 120 can comprise a first terminal 126 and a second terminal 128, which can serve as source/drain. In other words, the FinFET can represent a ferroelectric 1T memory cell (FeFET) with three-dimensional gate structure (e.g. fin 124a and memory cell 110). Thus, the memory cell 110 can be connected, for example, to the semiconductor device 120 such that the memory cell forms at least part of a gate structure of the semiconductor device 120.

According to an embodiment, the memory cell 110 according to FIG. 7a can be formed in a U-shape. For this, for example, the individual layers of the memory cell 110, as for example illustrated in FIGS. 2a to 2e, can be disposed/deposited successively on at least part of the outer walls of the fin 124a of the semiconductor device 120. Thus, a layer structure according to FIGS. 2a to 2e can be obtained perpendicular to the surfaces of the fin 124a. In other words, a layer sequence of the gate (e. g. the memory cell 110) in a cross-section horizontal to the fin 124a can correspond to the described layer sequences of FIGS. 2a to 2e. Analogously, other three-dimensional gate/channel geometry can be realized, e.g. in channels.

Thus, for example, according to FIG. 7b, the memory cell 110 can comprise an O-shape through which the fin 124a can be guided. According to an embodiment, the substrate 124 of the semiconductor device 120 can comprise a recess in which the memory cell 110 can be disposed.

According to an embodiment, the ferroelectric semiconductor device 100 of FIG. 7a can be connected to an additional ferroelectric capacitor which can, for example, be the memory cell 110 of FIG. 2c, via the first terminal 126 or the second terminal 128 (FeRAM, 1T-1C). In this case, the memory cell 110 can be replaced by a gate stack of a conventional FET. In this case, for example, the ferroelectric capacitor forms the memory cell 110.

According to an embodiment, the FinFET can comprise features and functionalities according to [36].

Figure 8:
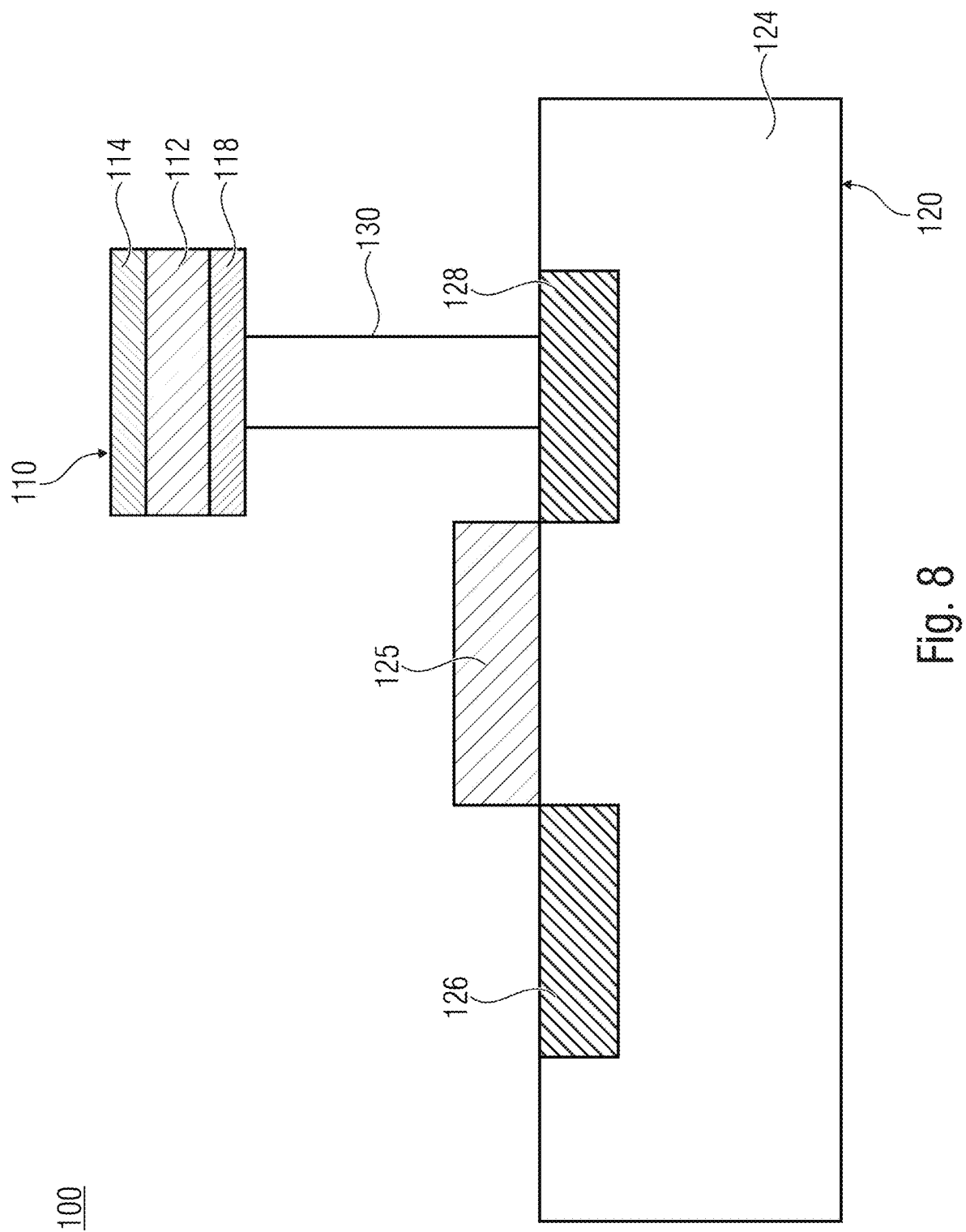
FIG. 8 is a schematic illustration of a ferroelectric semiconductor device, wherein a semiconductor device includes an FeRAM, according to an embodiment of the present invention.

FIG. 8 shows a schematic illustration of a ferroelectric semiconductor device 100 with a memory cell 110 and a semiconductor device 120 connected to the memory cell 110. The connection can, for example, be via lines 130. The memory cell 110 can be configured, for example, according to FIG. 2c and can hence comprise a first conductive layer 114, a ferroelectric memory layer 112 and a second conductive layer 118.

In other words, the semiconductor device 120 can comprise, for example, a FeRAM, wherein the memory cell 110 can form at least part of a capacitor structure of the semiconductor device 120. The semiconductor device 120 can comprise a substrate 124, a first terminal 126, a second terminal 128 and a gate 125. In other words, the ferroelectric semiconductor device 100 can represent a ferroelectric RAM cell (1T-1C)

The capacitor (memory cell 110) formed of conductive layers 114, 118 and the ferroelectric memory layer 112 can be connected to the second terminal 128 (source or drain contact) of the transistor (semiconductor device 120) via a conductor 130. The first terminal 126 and the second terminal 128 can form a source/drain. In this case, the gate 124 can correspond to the gate stack of a conventional FET (such as a planar MOSFET, a FinFET, HMET, etc.) (e. g., for example, consist merely of gate dielectric and gate contact on top of the same). However, it is also possible that the gate 150 is realized as memory cell and comprises a layer structure according to one of FIGS. 2a to 2e.

According to an embodiment, the semiconductor device 120 can be structured analogously to a DRAM cell, i.e. the same can consist of a transistor and a capacitor (1T-1C). Here, a dielectric of the capacitor (memory cell 110) can be replaced by a ferroelectric material (ferroelectric memory layer 112), which has a non-linear (hysteretic) current/voltage characteristic curve. Depending on the starting state of a polarization (normally perpendicular to the substrate/away from the substrate (the substrate can, for example, be the first conductive layer 114 or the second conductive layer 118)) of the ferroelectric memory layer 112, a flowing current may vary during a reading operation (of the ferroelectric semiconductor device 100). Thus, the ferroelectric semiconductor device 100 can unite advantages of non-volatile and volatile memory technologies.

According to an embodiment, an integrated circuit can comprise a ferroelectric semiconductor device 100 as illustrated, e. g. in FIG. 1, 6, 7 or 8.

Figure 9A:
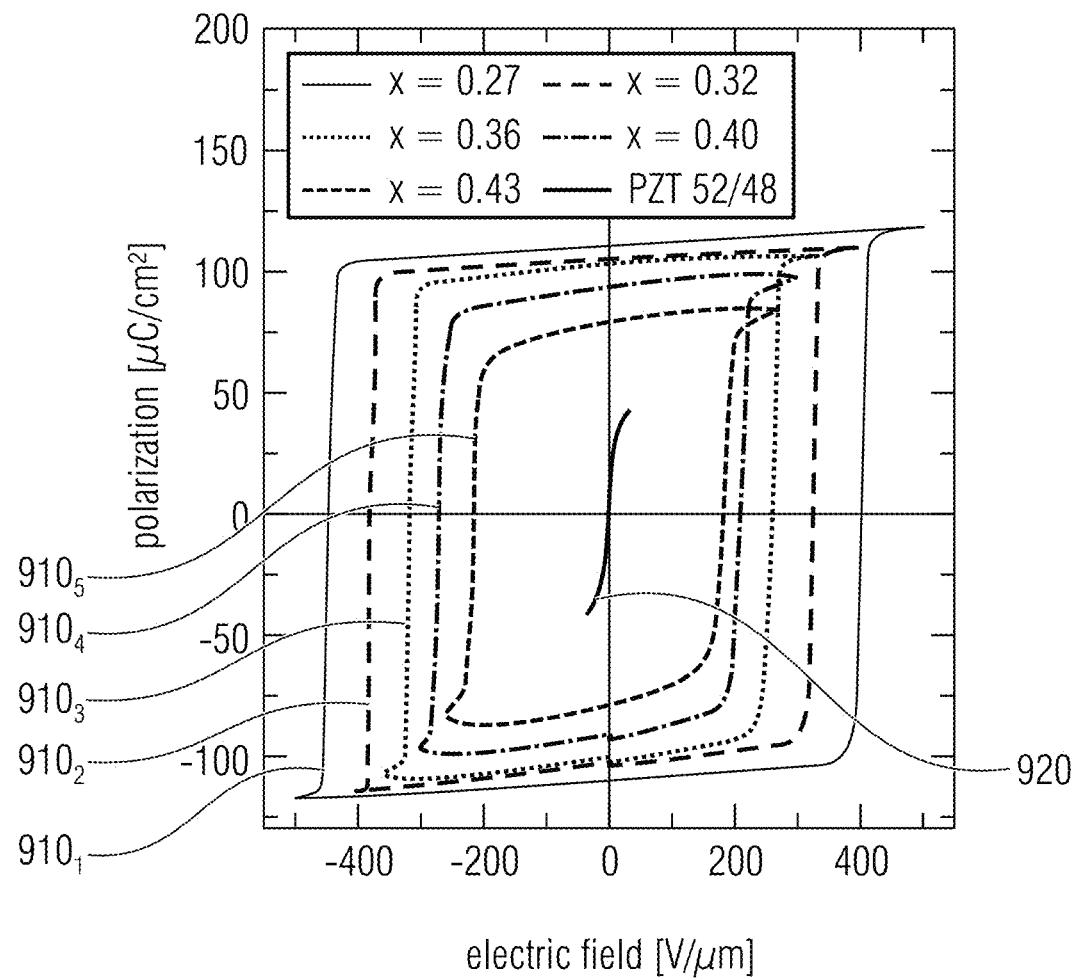
FIG. 9a is a diagram of P-E loops of a mixed crystal for a ferroelectric semiconductor device according to an embodiment of the present invention.
Figure 9B:
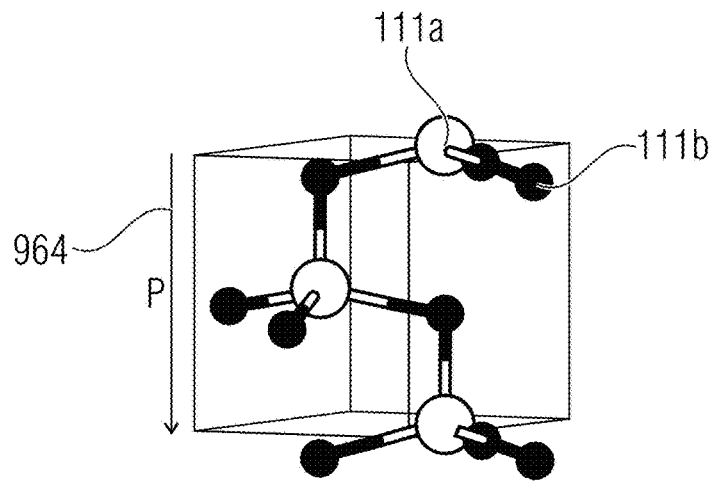
FIG. 9b is a schematic illustration of a mixed crystal of a memory cell for a ferroelectric semiconductor device with a metal polarization according to an embodiment of the present invention.
Figure 9C:
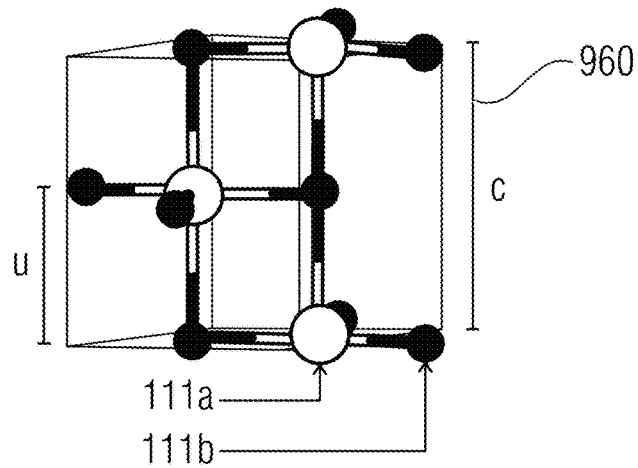
FIG. 9c is a schematic illustration of a mixed crystal of a memory cell for a ferroelectric semiconductor device having no polarization according to an embodiment of the present invention.
Figure 9D:
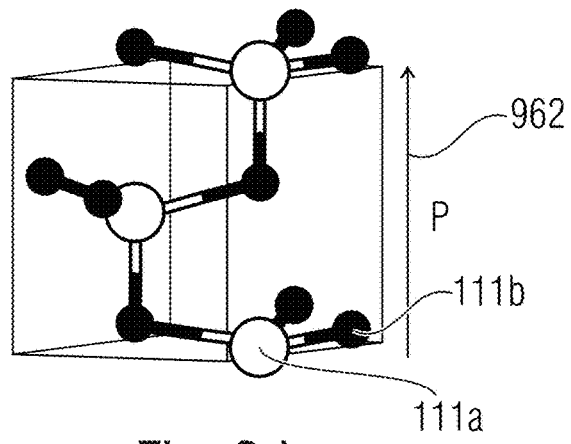
FIG. 9d is a schematic illustration of a mixed crystal of a memory cell for a ferroelectric semiconductor device having an N polarization according to an embodiment of the present invention.
Figure 9F:
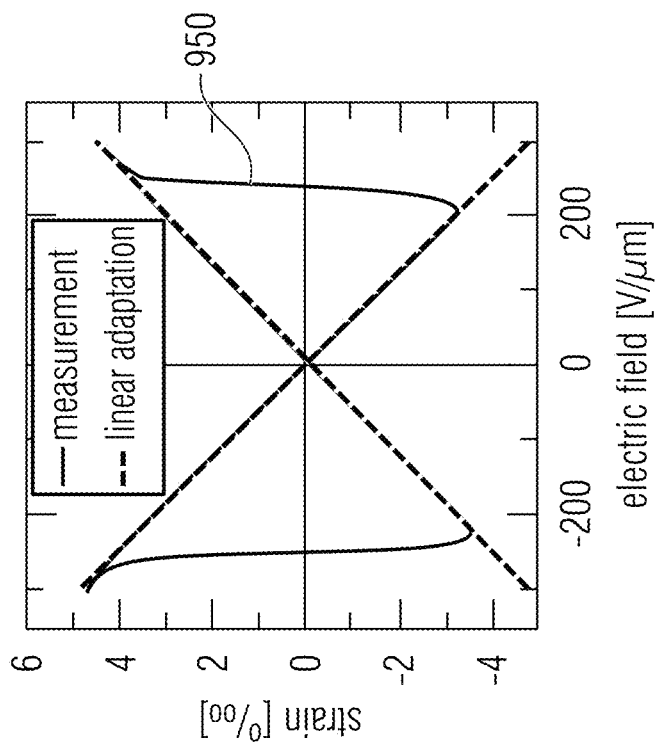
FIG. 9f is a diagram of a strain response to an electric field by a mixed crystal of a memory cell for a ferroelectric semiconductor device according to an embodiment of the present invention.

FIG. 9a shows a diagram of P-E loops $910_1$-$910_5$ of a ferroelectric memory layer of a memory cell for a ferroelectric semiconductor device. The ferroelectric memory layer includes, for example, ferroelectric $Al_{0.64}Sc_{0.36}N$ with an Sc content of x=0.27; 0.32; 0.36; 0.40 and 0.43. As a comparison, a P-E loop 920 of PZT 52/48 as illustrated in FIG. 9a. FIG. 9b and FIG. 9c show structures allocated to the respective polarization states. FIG. 9d shows a diagram that can represent a direct piezoelectric effect of the ferroelectric memory layer. Thus, in FIG. 9e, charge-strain curves of the ferroelectric memory layer can be illustrated as deposited 930 and after ferroelectric polarization inversion 940. According to an embodiment, the ferroelectric memory layer can comprise $Al_{0.64}Sc_{0.36}N$. FIG. 9f can represent a reciprocal effect of the ferroelectric memory layer. This can be, for example, a longitudinal strain response 950 of $Al_{0.64}Sc_{0.36}N$.

Here, experimental evidence for a first material including a group III nitride and a non-group III element will be reported, which is to be expected as new group of CMOS compatible ferroelectrics having considerable characteristics. A mixed crystal of a ferroelectric memory layer of a memory cell for a ferroelectric semiconductor device can include this material according to an embodiment, which can represent a mixed crystal based on technologically significant III nitride semiconductors. High remanent polarization, large and linear strain output, good temperature stability as well as systematically tunable coercive fields and imprint can be demonstrated in the exemplary case of $Al_{1-x}Sc_xN$ thin films (example for a ferroelectric memory layer). This knowledge can significantly contribute to a more comprehensive implementation of ferroelectric functionality (the ferroelectric memory layer with the mixed crystal of the material) in microelectromechanical systems (MEMS), ICs (integrated circuits) and thin film technology in general.

Ferroelectrics have a spontaneous electric polarization with a spatial orientation that can be switched when an electric field is applied. This makes the same an individual group with increased functionality among the piezoelectric materials. The potential of new ferroelectric material classes to significantly accelerate technological progress has recently been demonstrated based on the fast integration of ferroelectric hafnium-based thin films, for example in non-volatile field-effect transistors [5-7].

In a wurtzite structure of the mixed crystal, see FIG. 9b to FIG. 9d (space group P6$_3$mc), the three nitride semiconductors AlN, GaN and InN can comprise a spontaneous polarization along the c axis 960 which has its origin in the separation of the group III atoms 111a and nitrogen atoms 111b in individual atomic levels [8]. Thus, two anti-parallel polarization directions exist: N polar 962, see FIG. 9d and metal polar 964, see FIG. 9b (e. g. Ga- or Al polar). FIG. 9c shows the wurtzite structure with hexagonal layer structure.

Pure wurtzite III nitrides are pyroelectric materials and not ferroelectric, since it is known that the polarization direction of the pure wurtzite III nitrides cannot be switched in electric fields below their individual dielectric breakdown limit [2]. Due to the higher piezoelectric coefficients of AlN compared to GaN or InN, AlN is generally advantageous for piezoelectric applications [8]. Akiyama et al. have demonstrated that the piezoelectric response of mixed crystals formed of AlN and ScN increases monotonously with the Sc content as long as the wurtzite structure can be maintained [9, 10]. This relates to the presence of a metastable layered hexagonal phase in ScN [11, 12], which can again flatten the ion potential energy landscape of, e. g. wurtzite $Al_{1-x}Sc_xN$. Consequently, the wurtzite base level as well as the internal parameter u (the length of the metal nitrogen bond parallel to the c axis) can increase, i.e. a structural approximation to the layered hexagonal phase can take place, in particular at the Sc spaces [11, 13]. While the layered hexagonal structure, see FIG. 9c, itself is not polar, the same can be considered as transition state (u=½c) between the two polarization orientations of the wurtzite structure (see FIG. 9b and FIG. 9d). The sign of the polarization switches as soon as u passes ½c. Due to the flattening of the ion potential towards the hexagonal phase, it is determined that the energy barrier allocated to u=½c decreases while the Sc content increases. An adaptation of a mechanical stress of the wurtzite base level should allow a decrease of this barrier. Apart from the incorporation of ScN in AlN, GaN or InN, it has been predicted and/or determined for other metal nitrides, such as YN or MgN—NbN, that the same can lead to similar softening, an increased a lattice parameter and an improved piezoelectric response [12-16]. The key for ferroelectric switching, however, remains that the energy barrier between the two polarization states of the wurtzite structure can be sufficiently decreased, either by increasing the ratio of the non-III metal or by adapting the mechanical stress while the dielectric breakdown resistance of the pure III nitride is maintained up to a certain extent. For the class of group III nitride-based mixed crystals, an induced transition to paraelectric behavior could not be observed so far.

In the exemplary case of polycrystalline $Al_{1-x}Sc_xN$ thin films, it could not only be demonstrated that ferroelectric switching can actually be obtained in wurtzite III nitride-based mixed crystals, but also that the material has fascinating characteristics that are significant for the core applications of ferroelectric thin films. The films have been produced, for example, by reactive sputtering, either from an individual AlSc alloy target or by Ko sputtering of Al- and Sc targets. The examined $Al_{1-x}Sc_xN$ layers generally showed, e.g., a very good c axis orientation perpendicular to the substrate [17], although grains having secondary orientations/phases were observed for Sc content of x≥0.4.

FIG. 9a shows a diagram that shows that ferroelectric polarization inversion is possible, at the latest starting from an Sc content of x=0.27. Below the same (x=0.22), dielectric breakdown can occur before the coercive field $E_C$ has been completely reached. P-E (polarization across electric field) hysteresis loops of $Al_{1-x}Sc_xN$ with x=0.27 ($910_1$); x=0.32 ($910_2$); 0.36 ($910_3$); 0.40 ($910_4$) and 0.43 ($910_5$) are given in FIG. 9a. As a comparison, the P-E loop 920 of a $PbZr_{0.52}Ti_{0.48}O_3$(PZT 52/48) film, measured with the same parameters, is shown. For compensating the P-E loops (at least partly) with respect to the not insignificant leakage current at higher electric fields, modified dynamic leaking current compensation can be applied [18]. Generally, very large coercive fields (up to 400 V/µm at x=0.27), an almost undiminished polarization between the coercive fields and high remanent polarizations (110 µC/cm$^2$ at x=0.27) can be observed. The latter can be significantly above the theoretical calculations of the spontaneous polarization, both for pure AlN [8, 19](≈10 µC/cm$^2$) as well as $Al_{1-x}Sc_xN$ [20](≈30 µC/cm$^2$ at x=0.5). Above that, it has been detected that the polarization maximum can decrease with increasing Sc content, which should be explained merely partly by the increasing amount of incorrectly oriented grains and could also be a consequence of gradually reaching a non-polar (i.e. layered hexagonal) phase. The almost ideal box-shape of the polarization hysteresis and the large coercive fields can be based on a still considerable energy barrier allocated to the hexagonal phase, a good composition homogeneity and the wurtzite structure, which should allow merely rotations in the range of 180°.

Figure 9E:
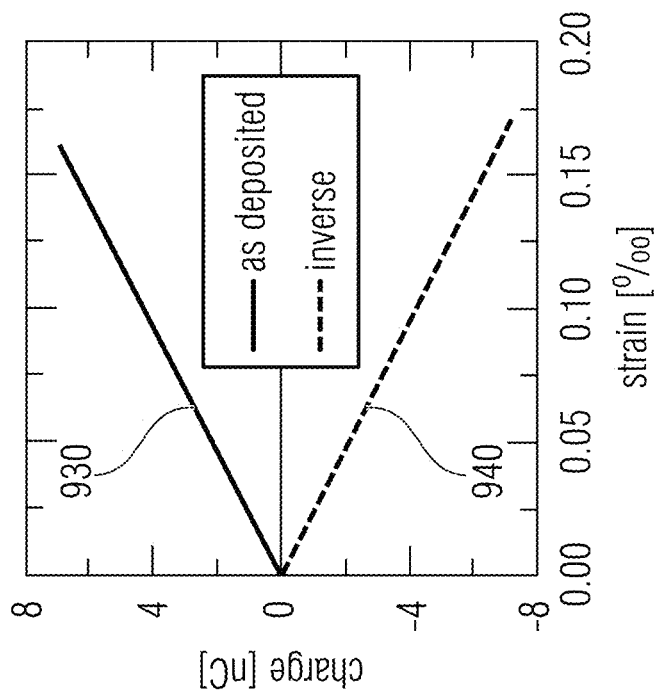
FIG. 9e is a diagram of charge-strain curve of a mixed crystal of a memory cell for a ferroelectric semiconductor device according to an embodiment of the present invention.

Measurements of a direct and inverse piezoelectric effect in ferroelectric $Al_{0.64}Sc_{0.36}N$ are illustrated in FIG. 9e or FIG. 9f. Both directions imply the option of a practically complete polarization inversion during ferroelectric switching. For measuring the direct piezoelectric effect on an inverted sample, a simple one-minute polarization method at room temperature can be used to switch between the polarization states. In this method, the effective transversal piezoelectric coefficient $e_{31,f}$ can invert from deposited −2.90 C/m$^2$ to 2.76 C/m$^2$, wherein both values can be considered as high for AlN-based mixed crystals [17, 21]. Repeated measurements of the piezoelectric response up to 30 weeks after polarization of the inverse capacitor did not show any deterioration, for example.

The butterfly-shaped curve of the longitudinal shift (FIG. 9f) of the inverse piezoelectric effect can comprise broad linear regimes with almost equal slopes that can correspond to an effective longitudinal piezoelectric coefficient $d_{33,1}$ of 15.7 pmN and −16.2 pm/V.

Figure 10A:
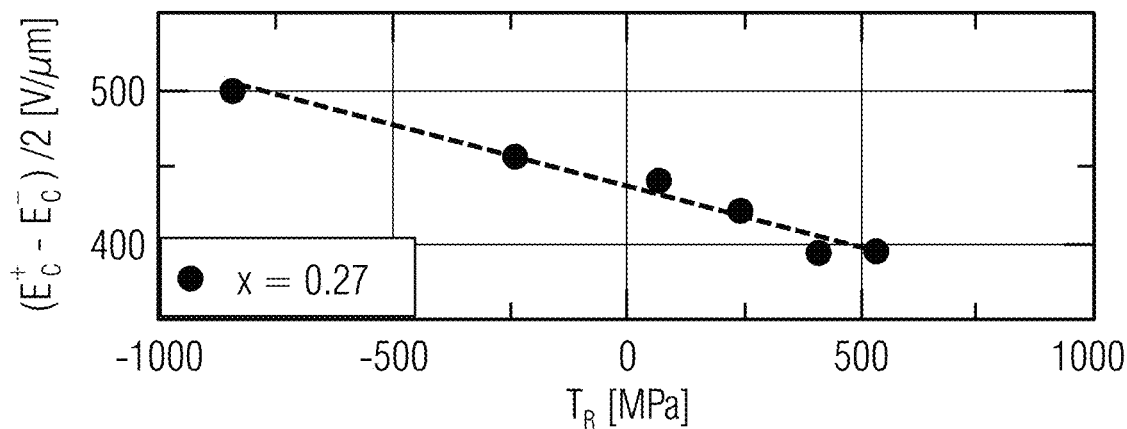
FIG. 10a is a diagram of an average coercive field $E_c$ versus mechanical stress $T_R$ of a mixed crystal of a memory cell for a ferroelectric semiconductor device according to an embodiment of the present invention.
Figure 10B:
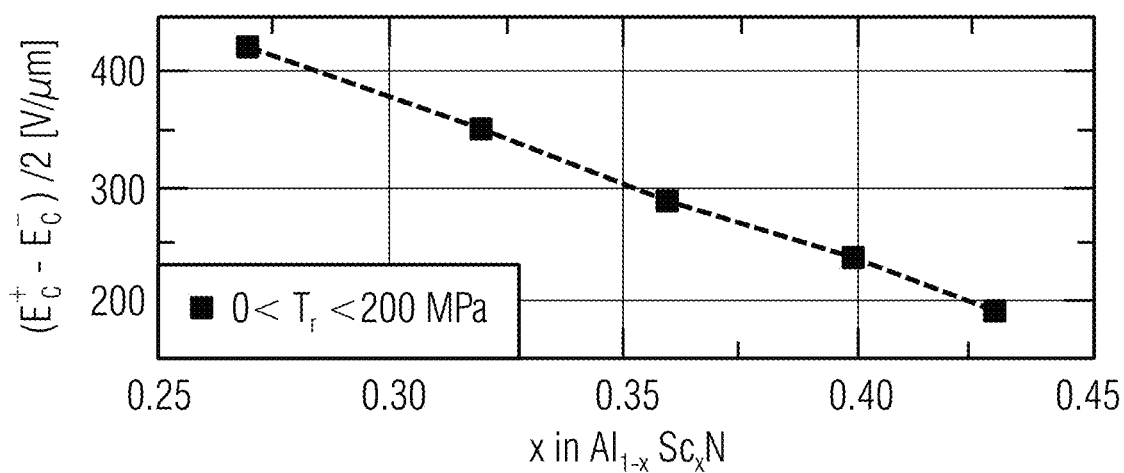
FIG. 10b is a diagram an average coercive field $E_c$ versus non-group III element content of a mixed crystal of a memory cell for a ferroelectric semiconductor device according to an embodiment of the present invention.

FIG. 10a shows a diagram of an average coercive field $E_C$ versus mechanical stress $T_R$ in ferroelectric memory layers of a memory cell for a ferroelectric semiconductor device. According to an embodiment, the ferroelectric memory layer can include $Al_{0.73}Sc_{0.27}N$, which can correspond to a chemical compound of a group III nitride AlN and a non-group III element Sc. Tensile stress can reduce the coercive field, compressive stress can increase the same. FIG. 10b shows a diagram of an average coercive field $E_C$ versus Sc content in ferroelectric memory layers, a memory cell for ferroelectric semiconductor device, with low mechanical stress. An increasing Sc content can effect reduction of the coercive field. Below an Sc content of x=0.27, the coercive field is above the disruptive strength of the material and can hence not be determined. This is equal to the fact that the material is, for example, not ferroelectric.

In other words, a dependence of the average coercive field on the intrinsic mechanical stress $T_R$, see FIG. 10a, and on the Sc content of the $Al1-xScxN$, see FIG. 10b, can be illustrated. Sc content and $T_R$ have been independently varied.

Ferroelectricity exists when the polarization of a layer can be spatially re-oriented by means of an external electric field. The average field where this re-orientation takes place is referred to as coercive field. This coercive field may not exceed the breakdown field of the material (i.e. the electric field where the layer becomes abruptly conductive and is hence destroyed). Thus, a layer of aluminum scandium nitride $Al1-xScxN$ is not ferroelectric with Sc content of x=0.20 (the coercive field is above the breakdown voltage, which, for AlScN, corresponds to a field strength of approximately 500V/μm). With Sc content of x=0.27, however, the layer is, e. g. already ferroelectric and still is with Sc content of x=0.43. The reason for this can be that the increasing additional metal content (non-group III element) reduces the coercive field (FIG. 10b). A similar effect can be caused by mechanical stress of the ferroelectric memory layer (FIG. 10a). The mechanical stress can be continuously impressed, for example by the deposition process.

The described effect has never been observed before for the relevant material class of group III nitrides. Based on the almost identical material structure of GaN, AlN as well as InN, it can be assumed that the above presented experimental results are generally transferable.

The control of $E_C$ is of great interest for a plurality of applications of ferroelectric materials. While a large linear regime, i.e. high coercive fields can be advantageous for actuator applications (to allow harmonic excitation with bipolar voltages), $E_C$ should, in the case of ferroelectric ICs, e. g., be adapted to the desired switching/threshold voltage of the circuit or the desired film thickness. In this context, not only the width but also the position along the axis of the electric field (imprint) of the P-E loop can be significant.

The coercive fields of $Al_{1-x}Sc_xN$ and hence the energy barrier allocated to u=½c can be systematically tuned both based on the Sc content as well as the mechanical stress $T_R$ resulting from the deposition process, as shown in FIG. 10a and FIG. 10b. While the Sc content can be adapted between the targets by varying the power ratio or can be given by the composition of the alloy target, the mechanical stress can be determined by manipulating the Ar flow into the sputter gas during the film growth [22, 23]. Thus, $E_C$ values between 190 V/μm (x=0.43, $T_r \approx 100$ MPa and 500 V/μm (x=0.27, $T_r \approx -800$ MPa) could be observed.

The effect of a planar mechanical stress that can result from the deposition process on $E_C$, could be explained by its effect on the base level of the wurtzite unit cell of the mixed crystal of the ferroelectric memory layer: tensile stress should increase the lattice parameter a in a grain having a c axis perpendicular to the substrate, while the compressive stress should cause the opposite effect. Thus, it is expected that a similar effect occurs on the energy barrier as an epitaxial strain [13]. In the area of the examined stress and the Sc composition, it has been determined that $E_C$ can depend almost linearly on the examined parameter.

Figure 11:
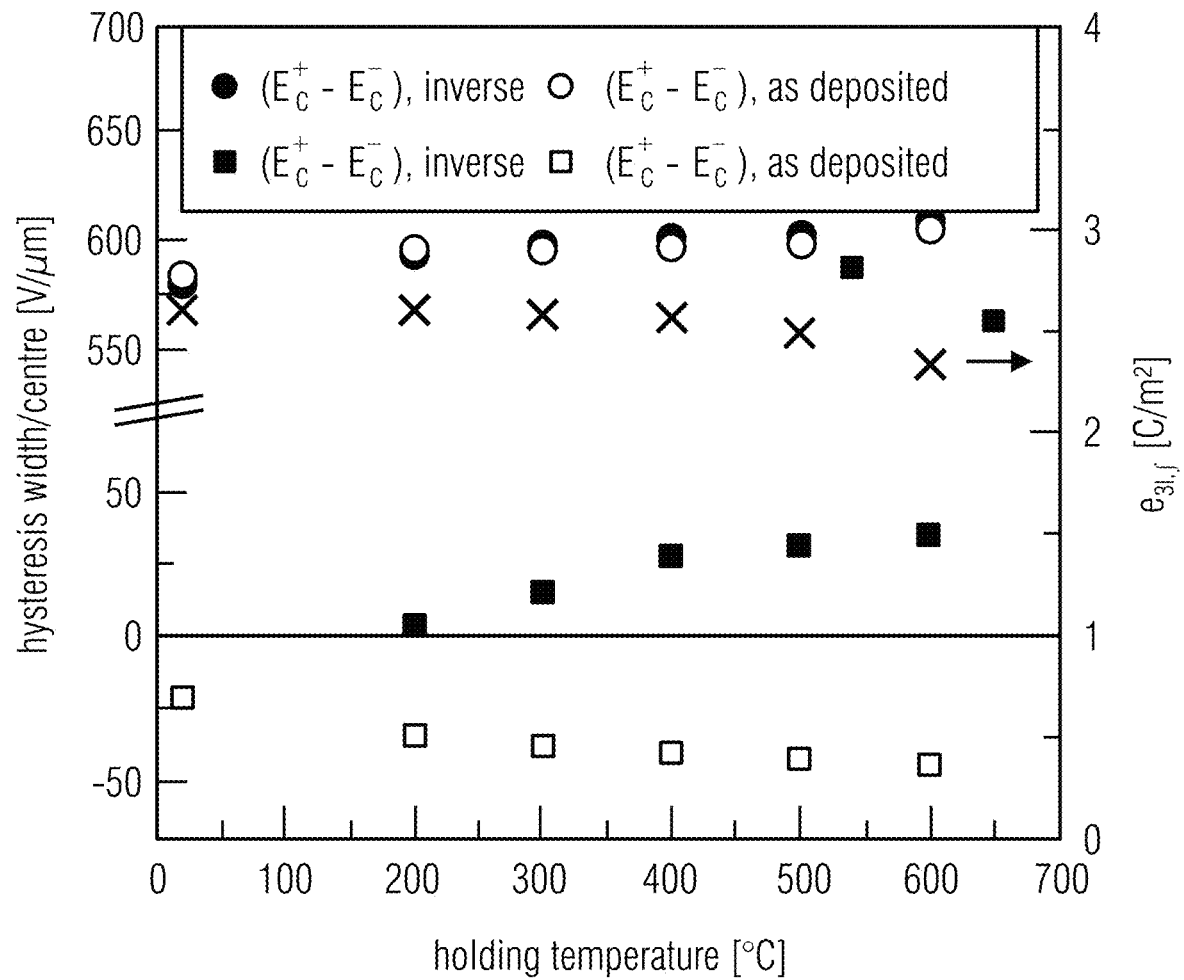
FIG. 11 is a diagram of a hysteresis width, a hysteresis center and a transverse piezoelectric coefficient versus a temperature for a mixed crystal of a memory cell of a ferroelectric semiconductor device according to an embodiment of the present invention.

FIG. 11 shows a diagram of width and center of P-E loops on deposited and inverted $Al_{0.64}Sc_{0.36}N$ capacitors as well as $e_{nf}$ of an inverted capacitor after temperature treatment (right axis). FIG. 11 can represent a transversal piezoelectric coefficient $e_{31,f}$ of an $Al_{0.64}Sc_{0.36}N$ sample after 5-minute temperature treatment at up to 600° C. The fact that the magnitude of the piezoelectric coefficient only changes insignificantly can mean that the spontaneous polarization of the material is also essentially maintained at more than 600° C.

The deposited and polarization invertible $Al_{0.64}Sc_{0.36}N$ capacitors can be an example for a memory cell consisting of a first conductive layer, a second conductive layer and a ferroelectric memory layer, wherein the layers are disposed in this order and the ferroelectric memory layer comprises a group III nitride AlN and a non-group III element Sc.

It could be shown that relevant ferroelectric characteristics (in particular an adjusted polarization) can be maintained even at temperatures of more than 600° C. This is a significant improvement compared to hafnium oxide-based compounds where significant weakening of the polarization can be observed already at 300° C. Also, the polarization of the ferroelectric memory layer is also maintained for a long time period (six months) without measurable weakening. This is a significant improvement compared to hafnium oxide-based compounds and in particular with respect to classic perovskites [34].

As information in the ferroelectric memory layer can be stored directly in the electric polarization, the above-described advantages can be directly transferred to such a memory element. The stored information would be maintained reliably over a long period, even at very high temperatures.

Deposited $Al_{1-x}Sc_xN$ films can show a polarization imprint between −20 and −30 V/μm. For controlling the imprint level and hence the center of the P-E hysteresis, temperature treatment proved possible (FIG. 11). Performing such a treatment of up to 600° C. on a capacitor with inverted polarization can result in a significant increase and a sign change of the imprint field. The imprint field can become smaller on a deposited capacitor, although with a lower rate. The overall width of the P-E loop increased, e. g. only slightly. This suggests that the polarization imprint in $Al_{1-x}Sc_xN$ could be defect-related and a slow thermally induced rearrangement of these charged defects can be used according to polarization state of the capacitors to modify the imprint, analogously to the observations in ferroelectric perovskites [24]. Therefore, it is possible to modify both the margin as well as the center of the $Al_{1-x}Sc_xN$ polarization hysteresis systematically by lattice expansion, adding of ScN as well as thermally induced polarization imprint.

Considering the broad spectrum of signals where films of pure AlN can be grown with good c axis orientation (up to below 10 nm) (FIG. 3) [25], the invention described herein offers a large degree of flexibility regarding an adaptation of the switching voltage to a specific application.

Above that, a polarization inversion can be maintained across the entire temperature range: $e_{31,f}$, for example, only slightly decreased during the temperature treatment steps (FIG. 11). Consequently, 600° C. can be considered as bottom limit for the paraelectric transition temperature of $Al_{0.64}Sc_{0.36}N$. Above 600° C., a deterioration of the electrodes can prevent further electric characterization of the capacitors.

It is assumed that this material (AlScN) is only the first of a novel class of ferroelectric wurtzite III nitride-based mixed crystals, wherein possible further candidates for this class are, for example, $Ga_{1-x}Sc_xN$, $Al_{1-x}Y_xN$ or $Al_{1-x-y}Mg_xNb_yN$.

From the point of view of the application, the unusual combination of a large linear range and stable polarization control by ferroelectric switching could allow, for example, advantages in the application of piezoelectric multilayered thin films for MEMS operation, detection and harvesting with a minimum number of carrier layers and the option of bipolar excitation. Above that, the base materials are CMOS compatible and, in the case of AlN and GaN, already well-established in clean rooms, which makes the invention described herein relevant in the context of non-volatile (high temperature) ICs.

Figure 12:
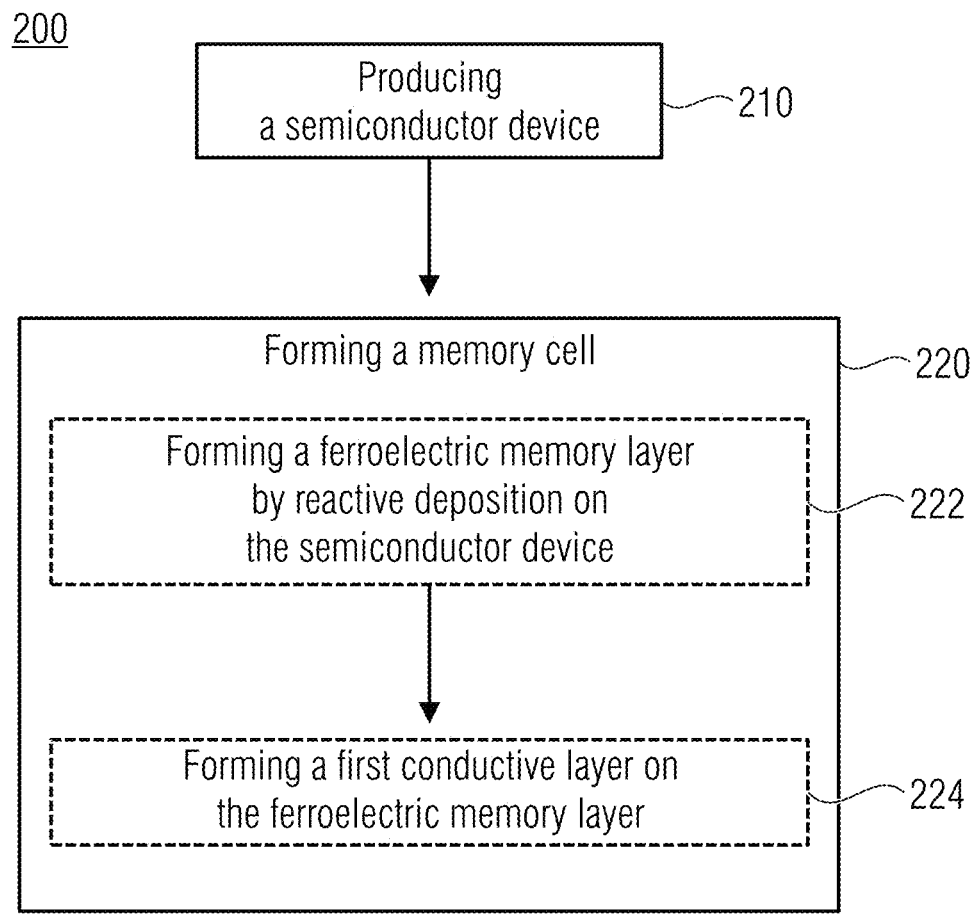
FIG. 12 is a block diagram of a method for producing a memory cell according to an embodiment of the present invention.

FIG. 12 shows a block diagram of a method 200 for producing a ferroelectric semiconductor device. The method 200 includes, e. g. producing 210 a semiconductor device and forming 220 a memory cell with a ferroelectric memory layer and a first conductive layer that can be disposed on the ferroelectric memory layer. The ferroelectric memory layer of the memory cell can comprise a mixed crystal with a group III nitride and a non-group III element. The memory cell can be connected to the semiconductor device.

Optionally, forming 220 the memory cell can comprise forming 222 the ferroelectric memory layer by means of reactive deposition on the semiconductor device and forming 224 the first conductive layer on the ferroelectric memory layer.

According to an embodiment, forming 220 the memory cell can comprise forming an insulating layer on the semiconductor device, forming a second conductive layer on the insulating layer, forming the ferroelectric memory layer by means of reactive deposition on the second conductive layer and forming 224 the first conductive layer on the ferroelectric memory layer.

Optionally, in the step of forming 220 the memory cell, at least three intermediate layers can be formed between the ferroelectric memory layer and the semiconductor device. Intermediate layers can comprise features and functionalities like the first conductive layer, the second conductive layer, the insulating layer and/or the ferroelectric memory layer.

For the function of the ferroelectric semiconductor device, it is advantageous that the first conductive layer is disposed, for example, on the side facing away from the semiconductor device (e. g. the ferroelectric memory layer between the first conductive layer and the semiconductor device). Thus, production of the semiconductor device can take place first and then optionally further layers can be deposited/formed thereon, such as isolators or electrodes (e. g. the insulating layer, the second conductive layer, intermediate layers, etc.) and finally the ferroelectric. Thus, the electrode referred to as first conductive layer can be deposited last.

According to an embodiment, the group III nitride can be AlN and the non-group III nitride can be Sc. Thus, the ferroelectric memory layer can also be referred to as $Al_{1-x}Sc_xN$ film (x can be a number between 0 and 1). The ferroelectric memory layer can be produced by reactive sputter deposition on oxidized 200 mm(100) Si wafers covered with an AlN/Pt bottom electrode (example for the first conductive layer). Process parameters for the $Al_{1-x}Sc_xN$ that can be deposited from dual targets (all except $Al_{0.64}Sc_{0.36}N$) can be taken from [17]. $Al_{0.64}Sc_{0.36}N$ can be deposited by a single alloy AlSc target with nominal Sc content of 43 at % and a purity of 99.9 at %. The power can be set to 600 W, a gas can flow into the chamber with up to 7.5 sccm Ar and 15 sccm $N_2$, wherein a substrate (e. g. the oxidized 200 mm(100) Si wafer with AlN/Pt bottom electrode) is maintained at 400° C., e.g., during the deposition. Film thickness of the ferroelectric memory layer can be set to 400 nm (all films with x=0.27), 600 nm (x=0.32; 0.36; 0.40 and PZT) or 1 μm (x=0.43). PZT films can be obtained by Sol-Gel deposition with previously published process details [26].

All listings of the materials for the memory cell and the semiconductor device, configurations of the memory cell and configurations of the semiconductor devices are to be considered as exemplarily and not as limiting.

Although some aspects have been described in the context of an apparatus, it is obvious that these aspects also represent a description of the corresponding method, such that a block or device of an apparatus also corresponds to a respective method step or a feature of a method step. Analogously, aspects described in the context of a method step or as a method step also represent a description of a corresponding block or detail or feature of a corresponding apparatus. Some or all of the method steps may be performed by a hardware apparatus (or using a hardware apparatus), such as a microprocessor, a programmable computer or an electronic circuit. In some embodiments, some or several of the most important method steps may be performed by such an apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

[1] Setter, N. et al. Ferroelectric thin films: Review of materials, properties, and applications. *J. Appl. Phys.* 100, 051606 (2006).

[2] Muralt, P., Polcawich, R. G. & Trolier-Mckinstry, S. Piezoelectric Thin Films for Sensors, Actuators, and Energy Harvesting. *MRS Bull.* 35, 658-664 (2009).

[3] Dawber, M., Rabe, K. M. & Scott, J. F. Physics of thin-film ferroelectric oxides. *Review of Modern Physics* 77, 1083-1130 (2005).

[4] Zhang, S., Xia, R., Lebrun, L., Anderson, D. & Shrout, T. R. Piezoelectric materials for high power, high temperature applications. *Mater. Lett.* 59, 3471-3475 (2005).

[5] Böscke, T. S., Muller, J., Bräuhaus, D., Schröder, U. & Böttger, U. Ferroelectricity in hafnium oxide thin films. *Appl. Phys. Lett.* 99, 102903 (2011).

[6] Martin, D. et al. Ferroelectricity in Si-Doped HfO2 revealed: A binary lead-free ferroelectric. *Adv. Mater.* 26, 8198-8202 (2014).

[7] Müller, J. & et al. Ferroelectric hafnium oxide : A CMOScompatible and highly scalable approach to future ferroelectric memories. 2013 *IEEE Int. Electron Devices Meet.* 10.8.1-10.8.4 (2013).

[8] Bernardini, F., Fiorentini, V. & Vanderbilt, D. Spontaneous polarization and piezoelectric constants of III-V nitrides. *Phys. Rev. B* 56, 24-27 (1997).

[9] Akiyama, M. et al. Enhancement of piezoelectric response in scandium aluminum nitride alloy thin films prepared by dual reactive cosputtering. *Adv. Mater.* 21, 593-596 (2009).

[10] Akiyama, M., Kano, K. & Teshigahara, A. Influence of growth temperature and scandium concentration on piezoelectric response of scandium aluminum nitride alloy thin films. *Appl. Phys. Lett.* 95, 162107 (2009).

[11] Tasnadi, F. et al. Origin of the anomalous piezoelectric response in wurtzite $Sc_xAl_{1-x}N$ alloys. *Phys. Rev. Lett.* 104, 137601 (2010).

[12] Farrer, N. & Bellaiche, L. Properties of hexagonal ScN versus wurtzite GaN and InN. *Phys. Rev. B* 66, 201203 (2002).

[13] Zhang, S., Holec, D., Fu, W. Y., Humphreys, C. J. & Moram, M. A. Tunable optoelectronic and ferroelectric properties in Sc-based III-nitrides. *J. Appl. Phys.* 114, 133510 (2013).

[14] Tholander, C. et al. Ab initio calculations and experimental study of piezoelectric $Y_xIn_{1-x}N$ thin films deposited using reactive magnetron sputter epitaxy. *Acta Mater.* 105, 199-206 (2016).

[15] Mayrhofer, P. M. et al. Microstructure and piezoelectric response of $Y_xAl_{1-x}N$ thin films. *Acta Mater.* 100, 81-89 (2015).

[16] Uehara, M. et al. Giant increase in piezoelectric coefficient of AlN by Mg—Nb simultaneous addition and multiple chemical states of Nb. *Appl. Phys. Lett.* 111, 112901 (2017).

[17] Fichtner, S. et al. Identifying and overcoming the interface originating c-axis instability in highly Sc enhanced AlN for piezoelectric micro-electromechanical systems. *J. Appl. Phys.* 122, 035301 (2017).

[18] Meyer, R., Waser, R., Prume, K., Schmitz, T. & Tiedke, S. Dynamic leakage current compensation in ferroelectric thin-film capacitor structures. *Appl. Phys. Lett.* 86, 142907 (2005).

[19] Ambacher, O. et al. Two-dimensional electron gases induced by spontaneous and piezoelectric polarization charges in N- and Ga-face AlGaN/GaN heterostructures. *J. Appl. Phys.* 85, 3222 (1999).

[20] Caro, M. et al. Piezoelectric coefficients and spontaneous polarization of ScAlN. *J. Phys. Condens. Matter* 27, 245901 (2015).

[21] Mertin, S. et al. Piezoelectric and structural properties of c-axis textured aluminium scandium nitride thin films up to high scandium content. *Surf. Coatings Technol.* 343, 2-6 (2018).

[22] Dubois, M.-A. & Muralt, P. Stress and piezoelectric properties of aluminum nitride thin films deposited onto metal electrodes by pulsed direct current reactive sputtering. *J. Appl. Phys.* 89, 6389 (2001)

[23] Fichtner, S., Reimer, T., Chemnitz, S., Lofink, F. & Wagner, B. Stress controlled pulsed direct current co-sputtered $Al_{1-x}Sc_xN$ as piezoelectric phase for micromechanical sensor applications. *APL Mater.* 3, 116102 (2015).

[24] Warren, W. L. et al. Voltage shifts and imprint in ferroelectric capacitors. *Appl. Phys. Lett.* 67, 866 (1996).

[25] Zaghloul, U. & Piazza, G. Synthesis and characterization of 10 nm thick piezoelectric AlN films with high c-axis orientation for miniaturized nanoelectromechanical devices. *Appl. Phys. Lett.* 104, 253101 (2014)

[26] Piorra, A. et al. Magnetoelectric thin film composites with interdigital electrodes. *Appl. Phys. Lett.* 103, 032902 (2013).

[27] Prume, K., Muralt, P., Calame, F., Schmitz-Kempen, T. & Tiedke, S. Piezoelectric Thin Films: Evaluation of Electrical and Electromechanical Characteristics for MEMS Devices. *IEEE Trans. Ultrason. Ferroelectr. Freq. Control* 54, 8-14 (2007).

[28] Gerber, P. et al. Short-time piezoelectric measurements in ferroelectric thin films using a double-beam laser interferometer. *Rev. Sci. Instrum.* 74, 2613-2615 (2003).

[29] Sivaramakrishnan, S., Mardilovich, P., Schmitz-Kempen, T. & Tiedke, S. Concurrent wafer-level measurement of longitudinal and transverse effective piezoelectric coefficients ($d_{33,f}$ and $e_{31,f}$) by double beam laser interferometry. *J. Appl. Phys.* 123, 014103 (2018).

[30] Janssen, G. C. A. M., Abdalla, M. M., van Keulen, F., Pujada, B. R. & van Venrooy, B. Celebrating the 100th anniversary of the Stoney equation for film stress: Developments from polycrystalline steel strips to single crystal silicon wafers. *Thin Solid Films* 517, 1858-1867 (2009).

[31] J. F. Scott, Ferroelectric Memories, Springer Heidelberg, 2000.

[32] T. Böscke, J. Müller, D. Bräuhaus, U. Schröder, U. Böttger, Appl. Phys. Lett. 2011, 99, 102903.

[33] T. Böscke, Integrated Circuit Including a Ferroelectric Memory Cell and Method of Manufacturing the Same, 2009, U.S. Pat. No. 8,304,823 B2.

[34] T. Shimizu, K. Katayama, T. Kiguchi, A. Akama, T. J. Konno, O. Sakata, H. Funakubo, Sci. Rep. 2016, 6, 1.

[35] J. Müller, P. Polakowski, S. Mueller, T. Mikalajick, ECS J. Solid State Sci. Tech., 2015, 4, N30

[36] U.S. Pat. No. 9,449,972 (B1)

The invention claimed is:

1. Ferroelectric semiconductor device, comprising:
    a memory cell with a ferroelectric memory layer and a first conductive layer disposed on the ferroelectric memory layer; and
    a semiconductor device connected to the memory cell,
    wherein the ferroelectric memory layer of the memory cell comprises a mixed crystal with at least one group III nitride and at least one non-group III element,
    wherein the non-group III elements occupy 20 to 50% of the spaces of group III atoms of the group III nitrides within the mixed crystal.

2. Ferroelectric semiconductor device according to claim 1, wherein the memory cell comprises an insulating layer, the ferroelectric memory layer and the first conductive layer that are disposed in that order; or
    wherein the memory cell comprises a second conductive layer, the ferroelectric memory layer and the first conductive layer that are disposed in that order; or
    wherein the memory cell comprises an insulating layer, a second conductive layer, the ferroelectric memory layer and the first conductive layer that are disposed in this order.

3. Ferroelectric semiconductor device according to claim 2, wherein the ferroelectric memory layer comprises a more limited extension parallel to a surface of the first conductive layer than the insulating layer and/or the second conductive layer.

4. Ferroelectric semiconductor device according to claim 1, wherein the memory cell comprises a U shape, an O shape, a cylindrical shape or a cuboid shape.

5. Ferroelectric semiconductor device according to claim 1, wherein the group III nitride of the mixed crystal of the ferroelectric memory layer comprises AlN, GaN, InN or a combination thereof.

6. Ferroelectric semiconductor device according to claim 1, wherein the non-group III element comprises a transition metal or Mg.

7. Ferroelectric semiconductor device according to claim 1, wherein the semiconductor device comprises an FeFET and the memory cell forms at least part of a gate structure of the semiconductor device.

8. Ferroelectric semiconductor device according to claim 7, wherein the FeFET is a planar MOSFET, a FinFET or an HEMT.

9. Ferroelectric semiconductor device according to claim 1, wherein the memory cell is configured to control the semiconductor device based on information stored in the memory cell.

10. Ferroelectric semiconductor device according to claim 9, wherein the memory cell is configured to put the semiconductor device either into an on-state or an off-state, based on information stored in the memory cell.

11. Ferroelectric semiconductor device according to claim 10, wherein, in the on-state, the semiconductor device comprises a conductivity of more than or equal to an upper threshold, and in the off-state, the same comprises a conductivity of less than or equal to a bottom threshold.

12. Ferroelectric semiconductor device according to claim 1, wherein the semiconductor device comprises an FeRAM and the memory cell forms at least part of a capacitor structure or a gate structure of the semiconductor device.

13. Integrated circuit with a ferroelectric semiconductor device according to claim 1.

* * * * *